United States Patent
Cheon et al.

(10) Patent No.: US 12,316,317 B1
(45) Date of Patent: May 27, 2025

(54) INPUT BUFFER CIRCUIT AND POWER MANAGEMENT INTEGRATED CIRCUIT INCLUDING THE SAME

(71) Applicant: Samsung Electronics Co., Ltd., Suwon-si (KR)

(72) Inventors: Hongjin Cheon, Suwon-si (KR); Youngkyun Park, Suwon-si (KR); Hyosang Youn, Suwon-si (KR); Deokgi Lee, Suwon-si (KR); Wookwan Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/646,899

(22) Filed: Apr. 26, 2024

(30) Foreign Application Priority Data

Nov. 23, 2023 (KR) .......................... 10-2023-0163936

(51) Int. Cl.
| | | |
|---|---|---|
| *H03K 19/0185* | (2006.01) | |
| *G05F 3/26* | (2006.01) | |
| *G09G 3/3233* | (2016.01) | |
| *H02M 1/00* | (2006.01) | |
| *H02M 3/158* | (2006.01) | |

(52) U.S. Cl.
CPC ..... *H03K 19/018521* (2013.01); *G05F 3/262* (2013.01); *G09G 3/3233* (2013.01); *G09G 2300/0819* (2013.01); *G09G 2300/0842* (2013.01); *G09G 2300/0861* (2013.01); *G09G 2330/021* (2013.01); *H02M 1/0045* (2021.05); *H02M 3/158* (2013.01)

(58) Field of Classification Search
CPC .......... G09G 2330/021; G09G 3/3233; H02M 1/0045; H03K 19/018521; G05F 3/262
USPC .......................................................... 345/212
See application file for complete search history.

(56) References Cited

U.S. PATENT DOCUMENTS

| | | |
|---|---|---|
| 5,160,854 A | 11/1992 | Martignoni et al. |
| 8,593,203 B2 | 11/2013 | Shankar et al. |
| (Continued) | | |

FOREIGN PATENT DOCUMENTS

| | | |
|---|---|---|
| CN | 103066989 A | 4/2013 |
| EP | 0468209 B1 | 8/1995 |

OTHER PUBLICATIONS

Khan et al. "A Single Supply Level Shifter for Multi-Voltage Systems" Proceedings of the 19th International Conference on VLSI Design (Jan. 2006).

*Primary Examiner* — Calvin C Ma
(74) *Attorney, Agent, or Firm* — Myers Bigel, P.A.

(57) ABSTRACT

An input buffer circuit includes a low voltage generator, a first hysteresis buffer and a first dual-supply level shifter. The low voltage generator is connected to a first power supply voltage having a first voltage level, generates a mirrored current based on the first power supply voltage and generates a second power supply voltage having a second voltage level smaller than the first voltage level. The second power supply voltage is independent from a variation of the first power supply voltage. The first hysteresis buffer operates based on the second power supply voltage and generates a first inverted reset signal having hysteresis based on an inverted reset signal. The first dual-supply level shifter operates based on the first and second power supply voltages and generates a second inverted reset signal by shifting the first inverted reset signal from the second voltage level to the first voltage level.

20 Claims, 19 Drawing Sheets

(56) References Cited

U.S. PATENT DOCUMENTS

| | | |
|---|---|---|
| 8,723,584 B2 | 5/2014 | Larsen et al. |
| 9,245,589 B2 | 1/2016 | Aoki et al. |
| 10,700,683 B1 | 6/2020 | Chen et al. |
| 11,146,253 B1 | 10/2021 | Jeon et al. |
| 2010/0328199 A1* | 12/2010 | Piasecki ................... G09G 3/18 345/98 |
| 2018/0131273 A1* | 5/2018 | de Cremoux ....... H02M 1/4208 |

* cited by examiner

INPUT BUFFER CIRCUIT AND POWER MANAGEMENT INTEGRATED CIRCUIT INCLUDING THE SAME

CROSS-REFERENCE TO RELATED APPLICATION(S)

This application claims priority under 35 U.S.C. § 119 to Korean Patent Application No. 10-2023-0163936, filed on Nov. 23, 2023 in the Korean Intellectual Property Office (KIPO), the disclosure of which is incorporated herein by reference in its entirety.

BACKGROUND

Example embodiments generally relate to electronic devices. More particularly, example embodiments relate to input buffer circuit and power management integrated circuits (PMICs) including the same.

Various flat panel display devices that reduce weight and volume have been developed. An organic light-emitting diode (OLED) display device has advantages such as rapid response speed and low power consumption among the flat panel display devices because the OLED device displays an image using an organic light emitting diode that emits light based on recombination of electrons and holes.

The OLED display device may include a display panel including a plurality of pixels arranged in a matrix format and each of the pixels includes transistors and an OLED element that emits light corresponding to a voltage applied to the OLED element.

An input buffer circuit in a power management integrated circuit included in an OLED display device needs to operate stably when a battery voltage varies.

SUMMARY

Some example embodiments provide an input buffer circuit of a power management integrated circuit (PMIC), which has a voltage level of a logic input independent from a variation of a battery voltage with reduced power consumption.

Some example embodiments provide a PMIC including an input buffer circuit which has a voltage level of a logic input independent from a variation of a battery voltage with reduced power consumption.

According to some example embodiments, an input buffer circuit includes a low voltage generator, a first hysteresis buffer and a first dual-supply level shifter. The low voltage generator is connected to a first power supply voltage having a first voltage level, generates a mirrored current based on the first power supply voltage and generates a second power supply voltage having a second voltage level smaller than the first voltage level. The second power supply voltage is independent from a variation of the first power supply voltage. The first Schmitt-trigger buffer operates based on the second power supply voltage and generates a first inverted reset signal having hysteresis based on an inverted reset signal. The first dual-supply level shifter operates based on the first power supply voltage and the second power supply voltage and generates a second inverted reset signal by shifting a logic high level of the first inverted reset signal from the second voltage level to the first voltage level.

According to some example embodiments, a PMIC includes an input buffer circuit, a voltage generator, a negative voltage generator and control logic. The input buffer circuit generates a second inverted reset signal and a second enable signal by buffering an inverted reset signal and an enable signal provided from an external host. The inverted reset signal and the enable signal correspond to general purpose input/output (GPIO) signals. The voltage generator is activated in response to a first internal enable signal and generates a high power supply voltage to be provided to a display panel including a plurality of pixels, based on a first power supply voltage corresponding to a battery voltage. The negative voltage generator is activated in response to a second internal enable signal and generates a low power supply voltage to be provided to the display panel, based on the first power supply voltage. The control logic generates the first internal enable signal and the second internal enable signal based on the second inverted reset signal and the second enable signal. The input buffer circuit includes a low voltage generator, a first hysteresis buffer and a first dual-supply level shifter. The low voltage generator is connected to a first power supply voltage having a first voltage level, generates a mirrored current based on the first power supply voltage and generates a second power supply voltage having a second voltage level smaller than the first voltage level. The second power supply voltage is independent from a variation of the first power supply voltage. The hysteresis buffer operates based on the second power supply voltage and generates a first inverted reset signal having hysteresis based on an inverted reset signal. The first dual-supply level shifter operates based on the first power supply voltage and the second power supply voltage and generates a second inverted reset signal by shifting a logic high level of the first inverted reset signal from the second voltage level to the first voltage level.

According to some example embodiments, an input buffer circuit includes a low voltage generator, a hysteresis buffer and a dual-supply level shifter. The low voltage generator is connected to a first power supply voltage having a first voltage level, generates a mirrored current based on the first power supply voltage and generates a second power supply voltage having a second voltage level smaller than the first voltage level. The second power supply voltage is independent from a variation of the first power supply voltage. The hysteresis buffer operates based on the second power supply voltage and outputs a first inverted reset signal having hysteresis based on an inverted reset signal. The dual-supply level shifter operates based on the first power supply voltage and the second power supply voltage and generates a second inverted reset signal by shifting a logic high level of the first inverted reset signal from the second voltage level to the first voltage level. The low voltage generator includes a plurality of n-channel metal oxide semiconductor (NMOS) transistors and a power transistor. The plurality of NMOS transistors are coupled in series between a first node and a ground (i.e., return) voltage, each of the plurality of NMOS transistors is diode-connected, and the power transistor is coupled between the first power supply voltage and the first node. The low voltage generator generates the mirrored current by duplicating a first current and provides the mirrored current to a first node and generates the second power supply voltage by providing a gate of the power transistor with a target voltage at the first node. The target voltage corresponds to a sum of threshold voltages of the plurality of NMOS transistors.

Accordingly, in the input buffer circuit and the PMIC, the low voltage generator generates a mirrored current based on a battery voltage, and generates a low voltage lower than the battery voltage and independent from variation of the battery voltage and the dual-supply level shifter shifts a voltage level of an input signal using the battery voltage and the low voltage. Therefore, a level of a logic high voltage and a level of a logic low voltage of the input buffer circuit is independent from the battery voltage. Accordingly, the input buffer circuit may operate stably even when a voltage level of the battery voltage decreases or increases and may reduce power consumption by generating the mirrored current based on small current.

BRIEF DESCRIPTION OF THE DRAWINGS

Illustrative, non-limiting example embodiments will be more clearly understood from the following detailed description taken in conjunction with the accompanying drawings, wherein like reference numerals (when used) indicate corresponding elements throughout the several views.

DETAILED DESCRIPTION

Figure 1:
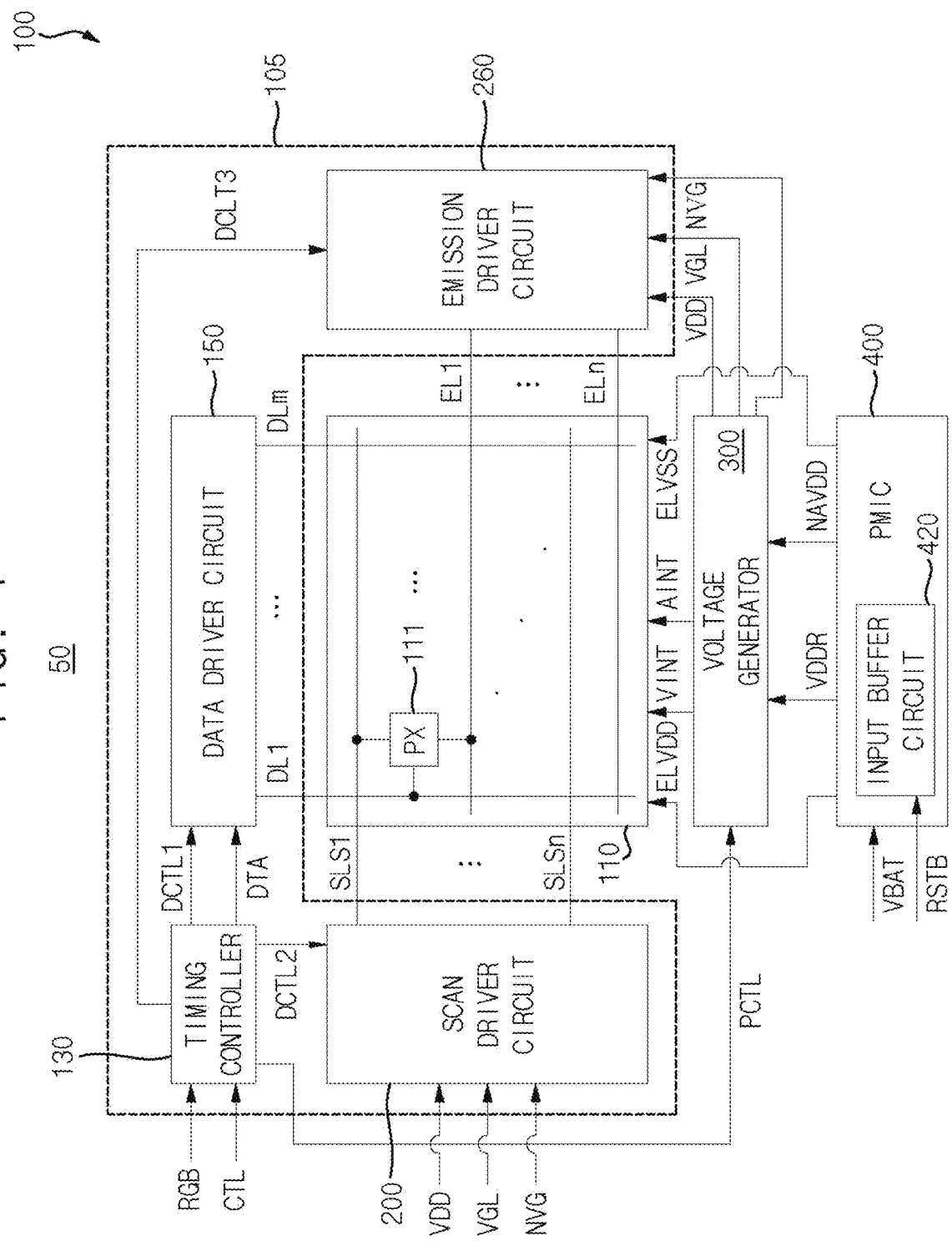
FIG. 1 is a schematic block diagram illustrating at least a portion of a mobile device according to example embodiments.

Example embodiments are described more fully hereinafter with reference to the accompanying drawings. Like or similar reference numerals refer to like or similar elements throughout the several views.

Components that are described in the detailed description with reference to the terms "unit", "circuit", "block", "-or", "-er", etc., may be implemented with software, hardware, or a combination thereof. For example, the software may be a machine code, firmware, an embedded code, and application software. For example, the hardware may include an electrical circuit, an electronic circuit, a processor, a computer, integrated circuit cores, a pressure sensor, a micro-electro-mechanical system (MEMS), a passive element, or a combination thereof.

FIG. 1 is a schematic block diagram illustrating at least a portion of a mobile device according to example embodiments.

Referring to FIG. 1, a mobile device 50 may include an organic light-emitting diode (OLED) display device 100 and a power management integrated circuit (PMIC) 400.

The OLED display device 100 may include a driving circuit 105, a display panel 110 and a voltage generator 300.

The driving circuit 105 and the voltage generator 300 may constitute a display driving integrated circuit.

The driving circuit 105 may include a timing controller 130, a data driver circuit 150, a scan driver circuit 200, and an emission driver circuit 260.

The timing controller 130, the data driver circuit 150, the scan driver unit circuit 200, and the emission driver circuit 260 may be electrically coupled to the display panel 110, such as, but not limited to, by using a chip-on flexible printed circuit (COF), a chip-on glass (COG), a flexible printed circuit (FPC), etc. The term "coupled" (or "coupling," or like terms, such as "contacted," "connected," "contacting," or "connecting"), as may be used herein, is intended to refer to a physical and/or electrical connection between two or more elements, and may include other intervening elements. As used herein, the term "and/or" includes any and all combinations of one or more of the associated listed items.

The display panel 110 may be electrically coupled to the scan driver circuit 200 of the driving circuit 105 through a plurality of scan line sets SLS1~SLSn (n is an integer greater than three), may be coupled to the data driver circuit 150 through a plurality of data lines DL1~DLm (m is an integer greater than three), and may be coupled to the emission driver circuit 260 of the driving circuit 105 through a plurality of emission control lines EL1~ELn. In one or more embodiments, m and n may be different, but embodiments are not limited thereto. The display panel 110 may include a plurality of pixels (PX) 111, and each pixel 111 is disposed at an intersection of each of the scan line sets SLS1~SLSn, each of the data lines DL1~DLm and each of the emission control lines EL1~ELn.

The display panel 110 may receive a high power supply voltage ELVDD and a low power supply voltage ELVSS from the PMIC 400.

The display panel 110 may receive a first initialization voltage VINT and a second initialization voltage AINT from the voltage generator 300. The emission driver circuit 260 may receive a first operating voltage VDD, a second operating voltage VGL and a negative voltage NVG from the voltage generator 300. In addition, the scan driver circuit 200 may receive the first operating voltage VDD, the second operating voltage VGL and the negative voltage NVG from the voltage generator 300.

The scan driver circuit 200 may apply a plurality of scan signals to each of the pixels 111 through the plurality of scan line sets SLS1~SLSn based on a second driving control signal DCTL2, which may be supplied by the timing controller 130.

The scan driver circuit 200 may enable at least two scan signals of the plurality of scan signals during a non-emission interval in which the pixels do not emit light such that the scan signals are partially overlapped during two consecutive horizontal periods. The horizontal period corresponds to a period of a horizontal synchronization signal which the timing controller 130 uses.

The data driver circuit 150 may apply a data voltage to each of the pixels 111 through the plurality of data lines DL1~DLm based on a first driving control signal DCTL1, which may be supplied by the timing controller 130.

The emission driver circuit 260 may apply an emission control signal to each of the pixels 111 through the plurality of emission control lines EL1~ELn based on a third driving control signal DCTL3, which may be supplied by the timing controller 130. Luminance of the display panel 110 may be adjusted based on the emission control signal.

The voltage generator 300 may provide the first initialization voltage VINT and the second initialization voltage AVINT to the display panel 110, and may provide the first operating voltage VDD, the second operating voltage VGL and the negative voltage NVG to the emission driver circuit 260 and the scan driver circuit 200, in response to a power control signal PCTL, which may be supplied by the timing controller 130. The voltage generator 300 may vary a level of the second initialization voltage AINT based on the power control signal PCTL indicating a frame rate of an image displayed in the display panel 110.

The timing controller 130 may receive input image data RGB and a control signal CTL, and may generate the first through third driving control signals DCTL1~DCTL3 and the power control signal PCTL based on the control signal CTL. The timing controller 130 may provide the first driving control signal DCTL1 to the data driver circuit 150, the second driving control signal DCTL2 to the scan driver circuit 200, the third driving control signal DCTL3 to the emission driver circuit 260 and the power control signal PCTL to the voltage generator 300. The timing controller 130 may receive the input image data RGB and arrange the input image data RGB to provide a data signal DTA to the data driver circuit 150.

The PMIC 400 may generate a first driving voltage VDDR having a positive level and a second driving voltage NAVDD having a negative level based on a battery voltage VBAT received from a battery and may provide the first driving voltage VDDR and the second driving voltage NAVDD to the voltage generator 300.

In addition, the PMIC 400 may generate the high power supply voltage ELVDD and the low power supply voltage ELVSS based on the battery voltage VBAT and may provide the high power supply voltage ELVDD and the low power supply voltage ELVSS to the display panel 110.

The PMIC 400 may include an input buffer circuit 420. The input buffer circuit 420 may generate a buffered signal by buffering an inverted reset signal RSTB and may provide the buffered signal to internal circuitry of the PMIC 400. The input buffer circuit 420 may be configured such that the buffered signal has a voltage level of a logic input independent from a variation of the battery voltage VBAT.

Figure 2:
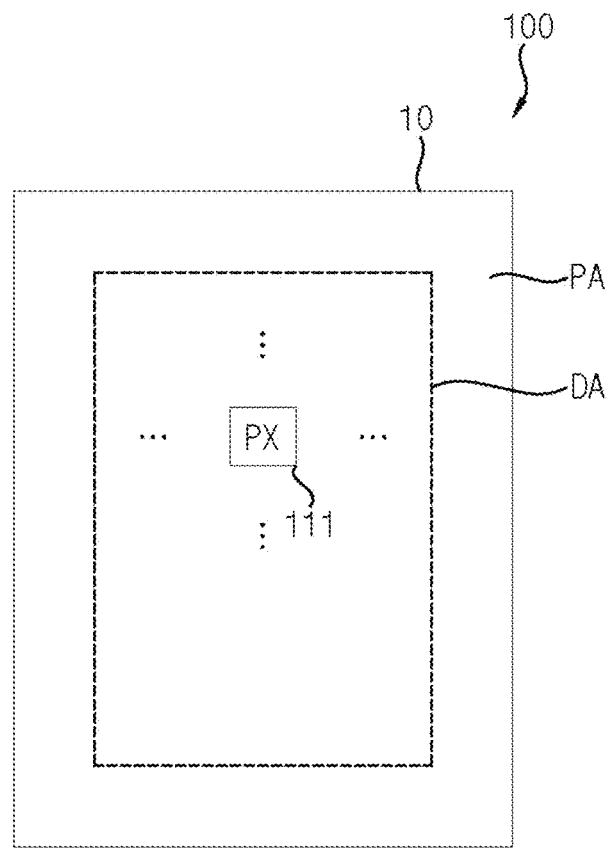
FIG. 2 is a schematic plan view of an organic light-emitting diode (OLED) display device in the mobile device of FIG. 1, according to example embodiments.

FIG. 2 is a schematic plan view of the OLED display device 100 in the mobile device 50 of FIG. 1, according to example embodiments.

Referring to FIG. 2, the OLED display device 100 includes a substrate 10. The substrate 10 may include a display region DA and a peripheral region PA outside (i.e., surrounding or extending around) the display region DA.

A plurality of pixels (PX) 111 may be arranged in the display region DA of the substrate 10. Various wirings for transmitting (i.e., conveying) an electrical signal to be applied to the driving circuit 105 and the display region DA may be in the peripheral region PA of the substrate 10.

The PMIC 400 in FIG. 1 may be disposed in the peripheral region PA.

Figure 3:
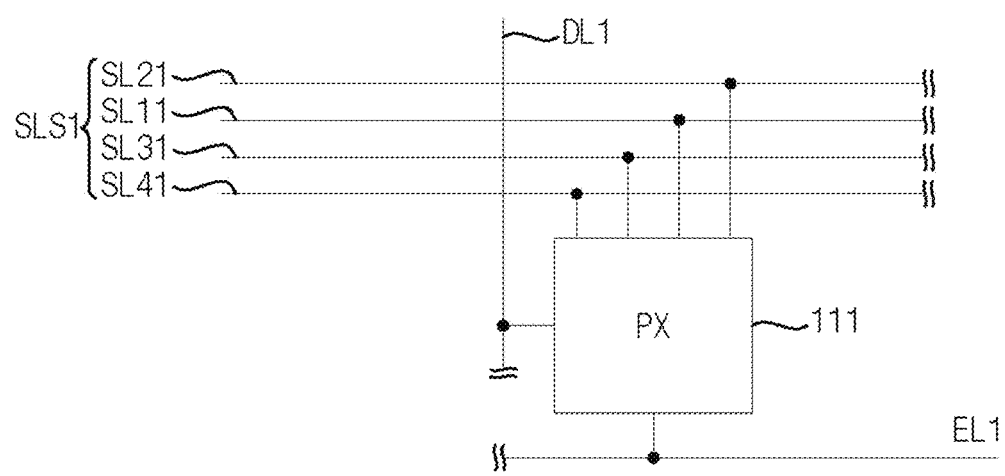
FIG. 3 is a schematic diagram illustrating an example connection of a pixel in the OLED display device shown in FIG. 1.

FIG. 3 is a schematic diagram illustrating at least a portion of an example connection of a pixel in the OLED display device shown in FIG. 1.

Figure 4:
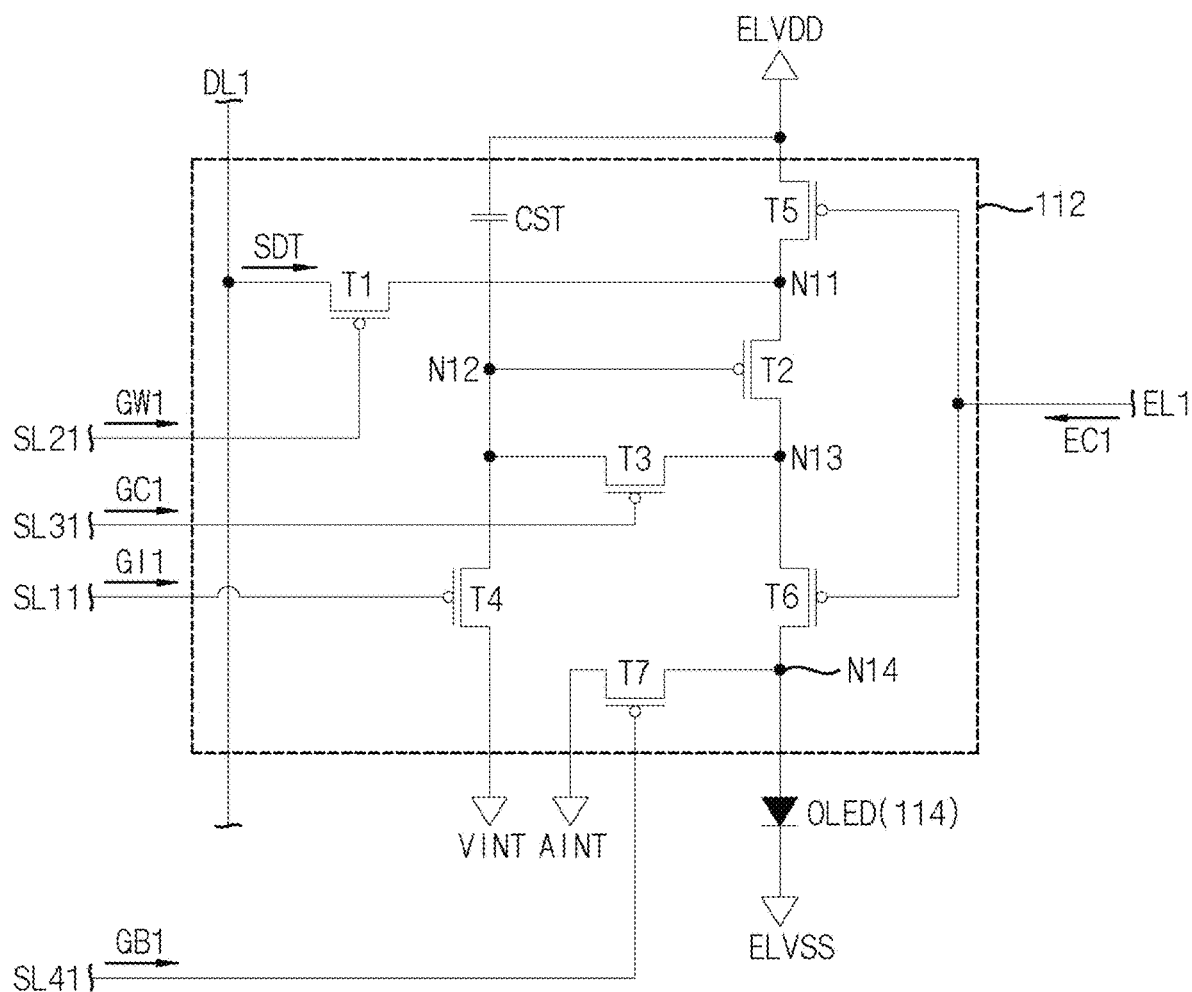
FIG. 4 is a circuit diagram illustrating an example of the pixel shown in the pixel connection of FIG. 3, according to example embodiments.

FIG. 4 is a circuit diagram illustrating an example of the pixel 111 shown in the pixel connection of FIG. 3, according to example embodiments.

In FIG. 3, a pixel 111 is electrically coupled to a first scan line set SLS1, a first data line DL1 and a first emission control line EL1, and the first scan line set SLS1 includes a first scan line SL11, a second scan line SL21, a third scan line SL31 and a fourth scan line SL41.

Referring to FIG. 4, the pixel 111 may include a pixel circuit 112 and an OLED 114. The pixel circuit 112 may include a switching transistor T1, a driving transistor T2, a compensation transistor T3, a first initialization transistor T4, first and second emission transistors T5 and T6, a second initialization transistor T7 and a storage capacitor CST.

The switching transistor T1 may include a p-channel metal-oxide semiconductor (PMOS) transistor that has a first electrode (first source/drain) coupled to the data line DL1 to receive a data voltage SDT, a gate electrode coupled to the second scan line SL21 to receive a second scan signal GW1 and a second electrode (second source/drain) coupled to a first node N11. The driving transistor T2 may include a PMOS transistor that has a first electrode coupled to the first node N11, a gate electrode coupled to a second node N12 and a second electrode coupled to a third node N13.

The compensation transistor T3 may include a PMOS transistor that has a gate electrode coupled to the third can line SL31 to receive a third scan signal GC1, a first electrode coupled to the second node N12 and a second electrode coupled to the third node N13. The first initialization transistor T4 may include a PMOS transistor that has a gate coupled to the first scan line SL11 to receive a first scan signal GI1, a first electrode coupled to the second node N12 and a second electrode receiving the first initialization voltage VINT.

The first emission transistor T5 may include a PMOS transistor that has a first electrode coupled to the high power supply voltage ELVDD, a second electrode coupled to the first node N11 and a gate electrode coupled to the first emission control line EL1 to receive the first emission control signal EC1. The second emission transistor T6 may include a PMOS transistor that has a first electrode coupled to the third node N13, a second electrode coupled to a fourth node N14 and a gate electrode coupled to the first emission control line EL1 to receive the first emission control signal EC1.

The second initialization transistor T7 may include a PMOS transistor that has a gate coupled to the fourth scan line SL41 to receive a fourth scan signal GB1, a first electrode receiving the second initialization voltage AINT and a second electrode coupled to the fourth node N14.

The storage capacitor CST may have a first terminal coupled to the high power supply voltage ELVDD and a second terminal coupled to the second node N12. The OLED 114 may have an anode coupled to the fourth node N14 and a cathode coupled to the low power supply voltage ELVSS.

The switching transistor T1 transfers the data voltage SDT to the storage capacitor CST in response to the second scan signal GW1 and the OLED 114 may emit light in response to the data voltage SDT stored in the storage capacitor CST to display an image.

The emission transistors T5 and T6 are turned-on or turned-off in response to the first emission control signal EC1 to provide a current to the OLED 114 or to intercept (i.e., stop) a current to the OLED 114. When the current to the OLED 114 is stopped, the OLED 114 does not emit light. Therefore, the emission transistors T5 and T6 are turned on or turned off in response to the first emission control signal EC1 to adjust a luminance of the display panel 110.

The compensation transistor T3 may electrically connect the second node N12 and the third node N13 in response to the third scan signal GC1. That is, the compensation transistor T3 may compensate for variance of threshold voltage of each driving transistor of each pixel 111 when the image is displayed by diode-connecting the gate electrode and the second electrode of the driving transistor T2. In a diode-connected arrangement, a PMOS transistor, as well as an n-channel metal oxide semiconductor (NMOS) transistor, is configured having its drain terminal connected to its gate, so that the gate voltage and the drain voltage of the device are equal.

The first initialization transistor T4 may transfer the first initialization voltage VINT to the second node N12 in response to the first scan signal GI1. The first initialization transistor T4 may initialize data voltage transferred to the driving transistor T2 during a previous frame by transferring the initialization voltage VINT to the gate electrode of the driving transistor T2. The second initialization transistor T7 may transfer the second initialization voltage AINT to the fourth node N14 in response to the fourth scan signal GB1 to discharge parasitic capacitance between the second emission transistor T6 and the OLED 114.

Figure 5:
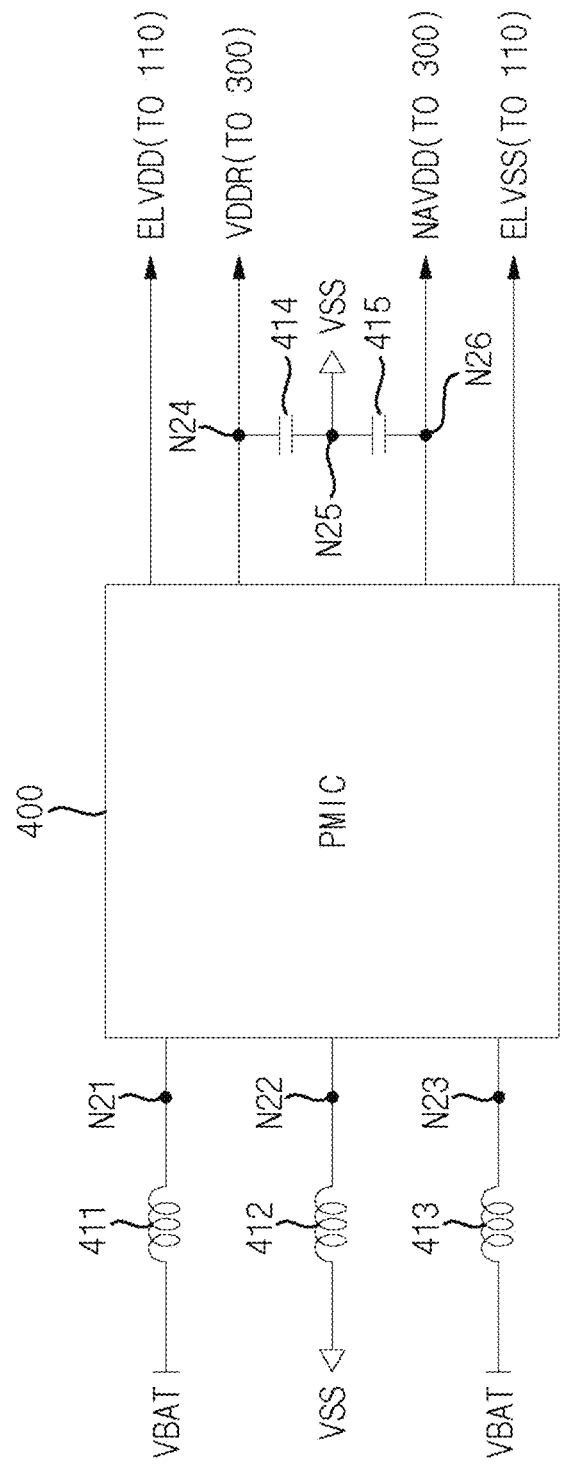
FIG. 5 is a schematic block diagram illustrating at least a portion of an example of a power management integrated circuit (PMIC) in the mobile device of FIG. 1, according to example embodiments.

FIG. 5 is a schematic block diagram illustrating an example connection of the PMIC 400 in the mobile device of FIG. 1, according to example embodiments.

Referring to FIG. 5, the PMIC 400 is coupled to a first inductor 411 receiving the battery voltage VBAT at a node N21, is coupled to a second inductor 412 coupled to a ground voltage VSS at a node N22, and is s coupled to a third inductor 413 receiving the battery voltage VBAT at a node N23.

The PMIC 400 may generate the high power supply voltage ELVDD and the first driving voltage VDDR based on the battery voltage VBAT, may provide the high power supply voltage ELVDD to the display panel 110 (FIG. 1) and provide the first driving voltage VDDR to the voltage generator 300 (FIG. 1).

The PMIC 400 may generate the low power supply voltage ELVSS an based on the ground voltage VSS, and may provide the low power supply voltage ELVSS to the display panel 110 (FIG. 1). A first capacitor 414 may be coupled between a node N24 connected to the PMIC 400 and a node N25 connected to the ground voltage VSS and may store charges generated by the first driving voltage VDDR.

The PMIC 400 may generate the second driving voltage NAVDD based on the battery voltage VBAT and may provide the second driving voltage NAVDD to the voltage generator 300 (FIG. 1).

A second capacitor 415 may be coupled between a node N26 connected to the PMIC 400 and the node N25 connected to the ground voltage VSS and may store charges generated by the second driving voltage NAVDD.

Figure 6:
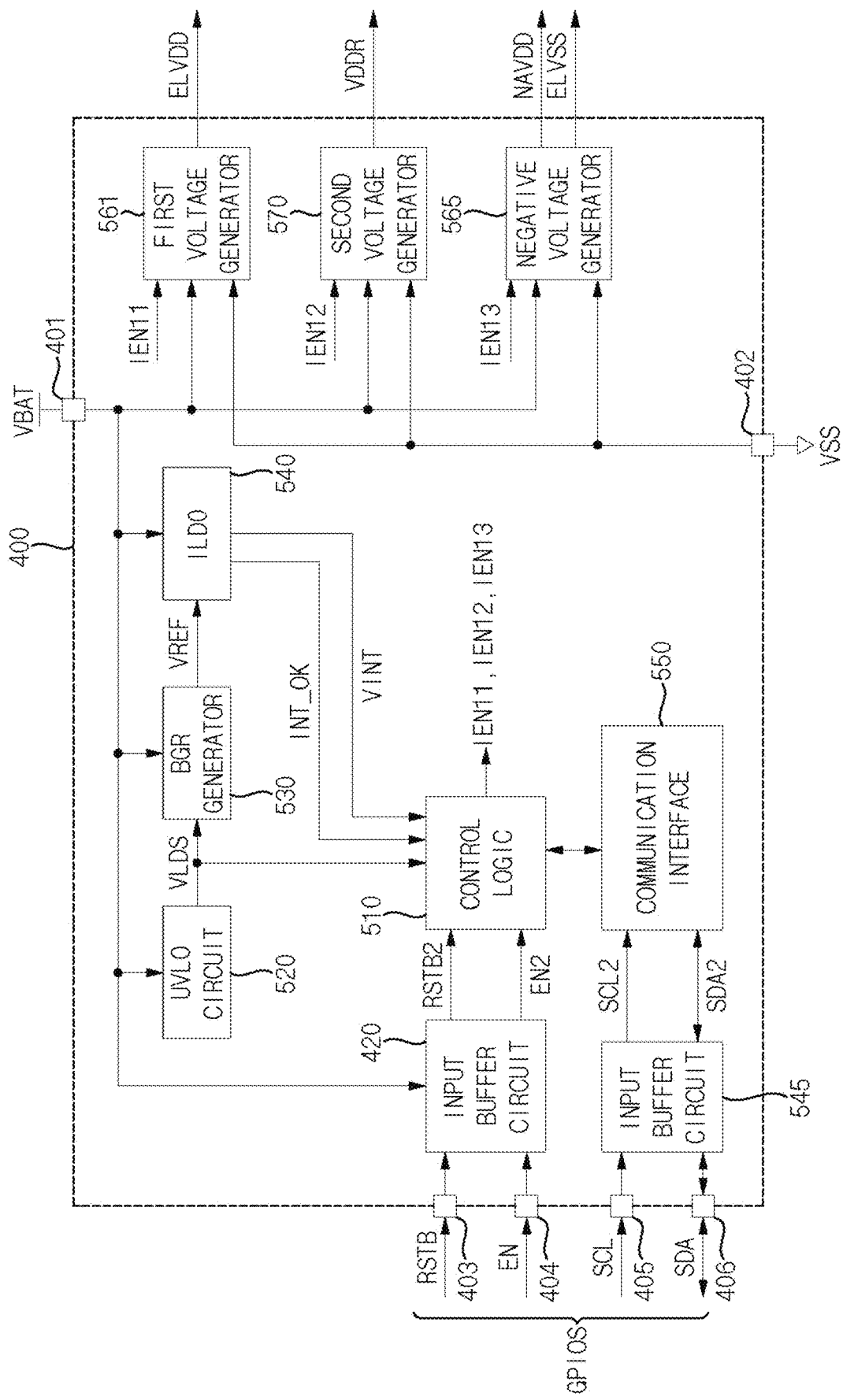
FIG. 6 is a schematic block diagram illustrating at least a portion of an example of the PMIC of FIG. 5, according to example embodiments.

FIG. 6 is a schematic block diagram illustrating an example of the PMIC 400 of FIG. 5, according to example embodiments.

Referring to FIG. 6, the PMIC 400 may include the input buffer circuit 420, control logic 510, an under voltage lock-out (UVLO) circuit 520, a reference voltage (BGR) generator 530 and an internal low drop-out (ILDO) regulator 540. The UVLO circuit 520, the BGR generator 530 and the ILDO regulator 540 may perform functions associated with an initial operation; that is, output signals generated by the UVLO circuit 520, the BGR generator 530 and the ILDO regulator 540 may not be available externally to the PMIC 400.

The PMIC 400 may further include an input buffer circuit 545, a communication interface 550, a first voltage generator 561, a second voltage generator 570 and a negative voltage generator 565.

The UVLO circuit 520 may receive the battery voltage VBAT, may compare the battery voltage VBAT with a reference level (e.g., internally generated or externally supplied reference voltage), may generate a voltage level detection signal VLDS which is activated in response to the battery voltage VBAT reaching the reference level, and may provide the voltage level detection signal VLDS to the BGR generator 530 and the control logic 510.

The BGR generator 530 may generate a reference voltage VREF based on the battery voltage VBAT, in response to an activation of the voltage level detection signal VLDS and may provide the reference voltage VREF to the ILDO regulator 540.

The ILDO regulator 540 may receive the battery voltage VBAT and may generate an internal voltage VINT based on the reference voltage VREF and the battery voltage VBAT. The ILDO regulator 540 may generate the internal voltage VINT in response to the reference voltage VREF reaching a first target level, may provide the internal voltage VINT to the control logic 510 and may provide an okay signal INT_OK to the control logic 510 in response to the reference voltage VREF reaching a second target level.

The input buffer circuit 420 may generate a second inverted reset signal RSTB2 and a second enable signal EN2 by buffering an inverted reset signal RSTB and an enable signal EN which are received from an external host through general purpose input/output (GPIO) pins (i.e., terminals) 403 and 404, respectively, and may provide the second inverted reset signal RSTB2 and the second enable signal EN2 to the control logic 510.

The control logic 510 may receive the internal voltage VINT, may operate based on the internal voltage VINT, may receive the voltage level detection signal VLDS and the okay signal INT_OK, may generate internal enable signals IEN11, IEN12 and IEN13 in response to the activation of the voltage level detection signal VLDS and the okay signal INT_OK and the activation of the second inverted reset signal RSTB2 and the second enable signal EN2 and may provide the internal enable signals IEN11, IEN12 and IEN13 to the first voltage generator 561, the second voltage generator 570 and the negative voltage generator 565, respectively.

The first voltage generator 561 may be activated based on the internal enable signal IEN11 and may generate the high power supply voltage ELVDD based on the battery voltage VBAT. The second voltage generator 570 may be activated based on the internal enable signal IEN12 and may generate the first driving voltage VDDR based on the battery voltage VBAT. The negative voltage generator 565 may be activated based on the internal enable signal IEN13 and may generate the second driving voltage NAVDD and the low power supply voltage ELVSS based on the ground voltage VSS.

The first voltage generator 561, the second voltage generator 570 and the negative voltage generator 565 may be coupled to the battery voltage VBAT and the ground voltage VSS.

The battery voltage VBAT may be provided to the PMIC 400 through a power terminal 401 and the ground voltage VSS may be provided to the PMIC 400 through a ground terminal 402.

The external host may drive a serial clock line SCL and a serial data line SDA between the external host and the PMIC 400. The external host may transmit the SCL signal (i.e., clock signal) to the input buffer circuit 545 through an SCL terminal 405. The input buffer circuit 545 may provide a second SCL signal SCL2 to the communication interface 550 by buffering the SCL signal. The external host may transmit the SDA signal (i.e., data signal) synchronized with the SCL signal to the input buffer circuit 545 through an SDA terminal 406. The input buffer circuit 545 may provide a second SDA signal SDA2 to the communication interface 550 by buffering the SDA signal.

The inverted reset signal RSTB, the enable signal EN, the SCL signal and the SDA signal may correspond to GPIO signals GPIOS. The inverted reset signal RSTB may correspond to one of the GPIO signals GPIOS and the enable signal EN may correspond to another of the GPIO signals GPIOS.

Figure 7:
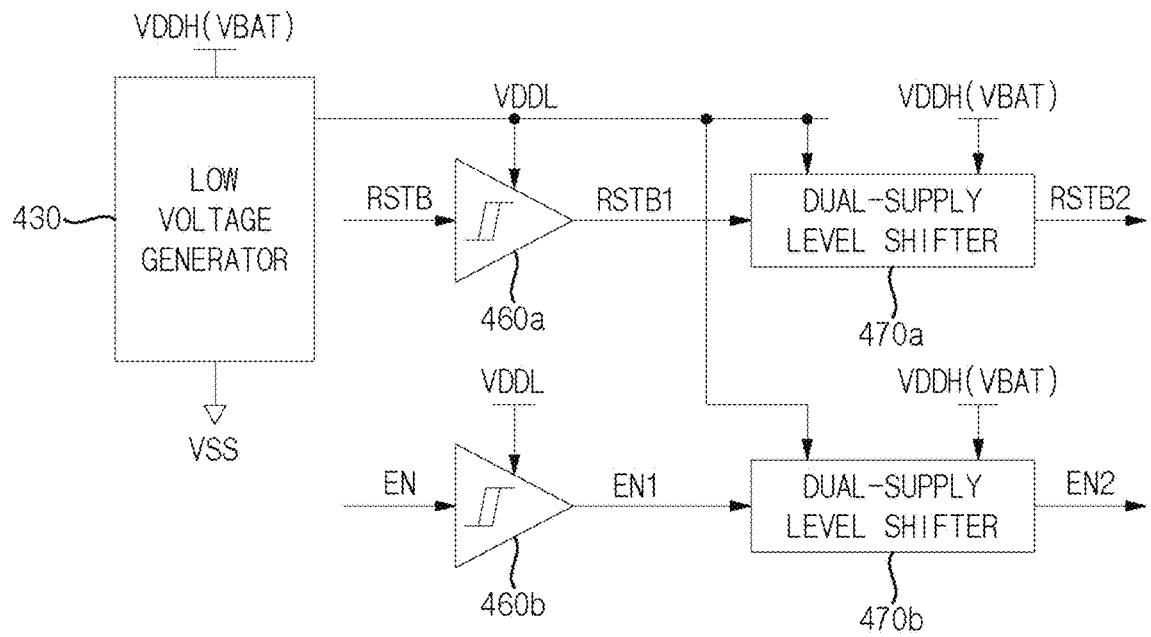
FIG. 7 is a schematic block diagram illustrating an example of an input buffer circuit in the PMIC of FIG. 6, according to example embodiments.

FIG. 7 is a schematic block diagram illustrating an example of the input buffer circuit 420 in the PMIC 400 of FIG. 6, according to example embodiments.

Referring to FIG. 7, the input buffer circuit 420 may include a low voltage generator 430, a first Schmitt-trigger buffer 460a, a second Schmitt-trigger buffer 460b, a first dual-supply level shifter 470a and a second dual-supply level shifter 470b. A Schmitt trigger is comparator circuit that incorporates hysteresis implemented by applying positive feedback to a non-inverting input of a comparator or differential amplifier. The hysteresis function of the Schmitt-trigger buffer 460a, 460b provides noise immunity by preventing a transition to a new logic state until the input signal has moved decidedly across the input threshold. Therefore, the first Schmitt-trigger buffer 460a may be referred to as a first hysteresis buffer and the second Schmitt-trigger buffer 460b may be referred to as a second hysteresis buffer.

The low voltage generator 430 may be connected to a first power supply voltage VDDH having a first voltage level, may generate a mirrored current based on the first power supply voltage VDDH and may generate a second power supply voltage VDDL having a second voltage level smaller than the first voltage level. The first power supply voltage VDDH may correspond to the battery voltage VBAT. The second power supply voltage VDDL may be independent from a variation of the first power supply voltage VDDH. The low voltage generator 430 may also be connected to ground voltage VSS.

The first Schmitt-trigger buffer 460a may operate based on the second power supply voltage VDDL and may output a first inverted reset signal RSTB1 by Schmitt-triggering the inverted reset signal RSTB supplied as an input to the first Schmitt-trigger buffer 460a. That is, the first Schmitt-trigger buffer 460a may generate the first inverted reset signal RSTB1 having hysteresis based on the inverted reset signal RSTB supplied as an input to the first Schmitt-trigger buffer 460a.

The second Schmitt-trigger buffer 460b may operate based on the second power supply voltage VDDL and may output a first enable signal EN1 by Schmitt-triggering the enable signal EN supplied as an input to the second Schmitt-trigger buffer 460b. That is, the second Schmitt-trigger buffer 460b may generate the first enable signal EN1 having hysteresis based on the enable signal EN supplied as an input to the second Schmitt-trigger buffer 460b.

The first dual-supply level shifter 470a may operate based on the first power supply voltage VDDH and the second power supply voltage VDDL and may generate a second inverted reset signal RSTB2 by shifting a logic high level of the first inverted reset signal RSTB1 from the second voltage level to the first voltage level.

The second dual-supply level shifter 470b may operate based on the first power supply voltage VDDH and the second power supply voltage VDDL and may generate a second enable EN2 by shifting a logic high level of the first enable signal EN1 from the second voltage level to the first voltage level.

Because the first Schmitt-trigger buffer 460a and the second Schmitt-trigger buffer 460b operate based on the second power supply voltage VDDL that is independent from a variation of the first power supply voltage VDDH, a level of a logic high voltage VIH and a level of a logic low voltage VIL of each of the first Schmitt-trigger buffer 460a and the second Schmitt-trigger buffer 460b may be independent from the first power supply voltage VDDH.

A configuration of the input buffer circuit 545 (see FIG. 6) may be substantially the same as or similar to a configuration of the input buffer circuit 420 of FIG. 7.

Figure 8A:
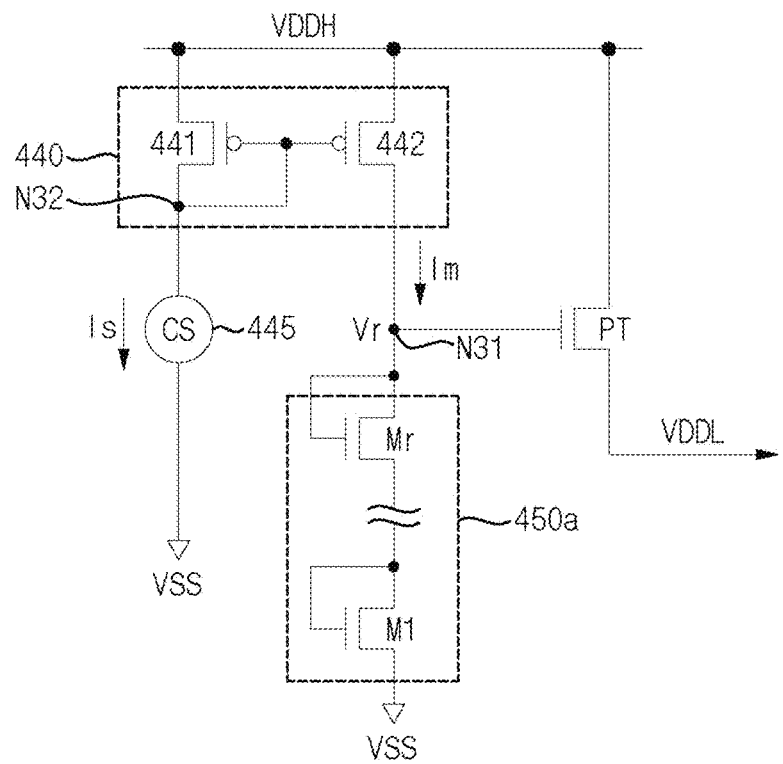
FIG. 8A is a schematic block diagram illustrating an example of a low voltage generator in the input buffer circuit of FIG. 7 according to example embodiments.

FIG. 8A is a schematic block diagram illustrating an example implementation of the low voltage generator 430 in the input buffer circuit 420 of FIG. 7, according to example embodiments.

Referring to FIG. 8A, a low voltage generator 430a may include, a current mirror circuit 440, a current source CS 445, a target voltage generation unit 450a and a power transistor PT. A current mirror is a type of circuit configured to replicate a current (an input reference current) through one active device by controlling an output current in another active device, keeping the output current substantially constant regardless of loading.

The current source 445 may generate a first current Is sinking (i.e., flowing) to the ground voltage VSS. Although shown as an ideal current source, the current source 445 may be implemented using various known circuits for generating a constant (reference) current.

The current mirror circuit 440 may be connected to the first power supply voltage VDDH and the current source 445, may generate a mirrored current Im by mirroring the first current Is and may provide the mirrored current Im to a first node N31.

The first current Is may be set to have a magnitude equal to or smaller than 100 mA for reducing a standby current, although embodiments are not limited thereto. Therefore, a power consumption of the low voltage generator 430a may be reduced.

The target voltage generation unit 450a may include a plurality of n-channel metal oxide semiconductor (NMOS) transistors M1, . . . , Mr coupled in series between the first node N31 and the ground voltage VSS. Here, r is an integer greater than two. Each of the plurality of NMOS transistors M1, . . . , Mr is diode-connected and the plurality of NMOS transistors M1, . . . , Mr may operate a plurality of diodes coupled in series. That is, each of the plurality of NMOS transistors M1, . . . , Mr may have a drain and a gate coupled to each other.

The power transistor PT, which may be an NMOS transistor, may have a drain coupled to the first power supply voltage VDDH, a gate coupled to the first node N31 and a source providing the second power supply voltage VDDL.

Therefore, the target voltage generation unit 450a (i.e., the plurality of NMOS transistors M1, . . . , Mr) may provide the gate of the power transistor PT with a target voltage Vr corresponding to a sum of threshold voltages of each of the plurality of NMOS transistors M1, . . . , Mr, at the first node N31, and the power transistor PT, connected in a source follower configuration, may adjust a level of the second power supply voltage VDDL based on the target voltage Vr.

In example embodiments, the power transistor PT may correspond to a native NMOS transistor having substantially zero threshold voltage, and the level of the second power supply voltage VDDL may be the same as a level of the target voltage Vr.

In example embodiments, the power transistor PT may correspond to an NMOS transistor having non-zero threshold voltage, and the level of the second power supply voltage VDDL may correspond to a value obtained by subtracting a threshold voltage of the NMOS transistor from the level of the target voltage Vr.

Because each of the plurality of NMOS transistors M1, . . . , Mr is diode-connected, the level of the target voltage Vr may be determined based on a number of the plurality of NMOS transistors M1, . . . , Mr or may be determined based on a size of each of the plurality of NMOS transistors M1, . . . , Mr. The size of each of the plurality of NMOS transistors M1, . . . , Mr may be associated with a ratio of a channel length over a channel width of each of the plurality of NMOS transistors M1, . . . , Mr.

The current mirror circuit 440 may include a first p-channel metal-oxide semiconductor (PMOS) transistor 441 and a second PMOS transistor 442.

The first PMOS transistor 441 may have a source coupled to the first power supply voltage VDDH, a gate coupled to the current source 445 at a second node N32 and a drain coupled to the current source 445 at the second node N32. The second PMOS transistor 442 may have a source coupled to the first power supply voltage VDDH, a drain coupled to the first node N31 and a gate coupled to the second node N32 and may provide mirrored current Im to the first node N31.

Figure 8B:
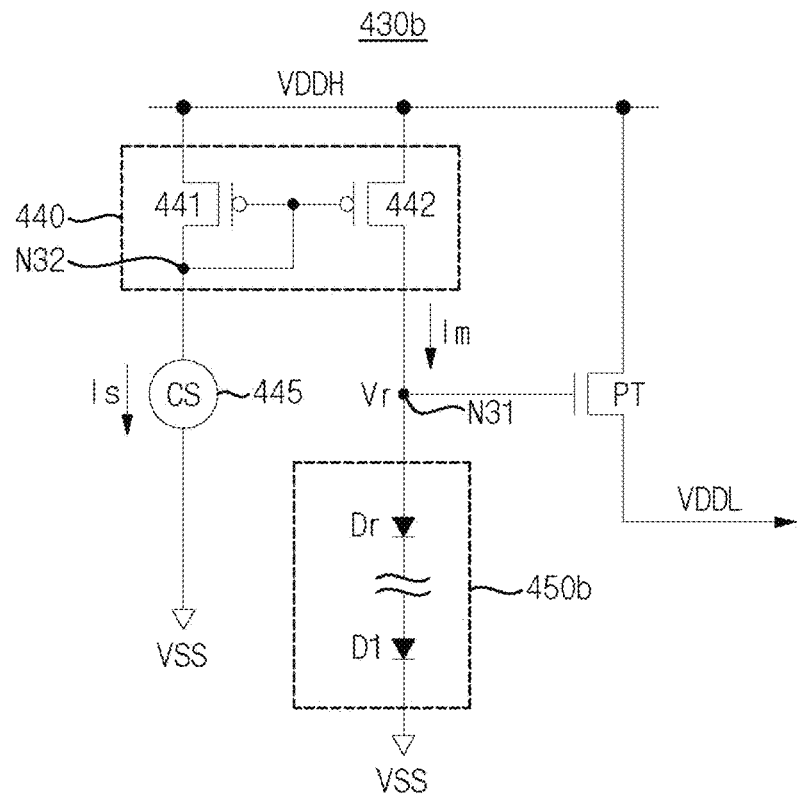
FIG. 8B is a circuit diagram illustrating an example of a low voltage generator in the input buffer circuit of FIG. 7, according to example embodiments.

FIG. 8B is a is a schematic block diagram illustrating another example implementation of the low voltage generator 430 in the input buffer circuit 420 of FIG. 7, according to example embodiments.

Referring to FIG. 8B, a low voltage generator 430b may include, a current mirror circuit 440, a current source CS 445, a target voltage generation unit 450b and a power transistor PT.

The current source 445 may generate a first current Is sinking to the ground voltage VSS.

The current mirror circuit 440 may be connected to the first power supply voltage VDDH and the current source 445, may generate a mirrored current Im by mirroring the first current Is and may provide the mirrored current Im to a first node N31.

The target voltage generation unit 450b may be include a plurality of diodes D1, . . . , Dr coupled in forward-biased direction between the first node N31 and the ground voltage VSS. The plurality of diodes D1, . . . , Dr may be connected in series between the first node N31 and the ground voltage VSS. That is, each of the plurality of diodes D1, . . . , Dr may be forward-biased, wherein a cathode of one diode is connected to an anode of an adjacent diode in the series chain, and wherein the cathode of the first diode D1 may be connected to the ground voltage VSS and the anode of the r-th diode Dr may be connected to the first node N31.

The power transistor PT, which may be an NMOS transistor, may have a drain coupled to the first power supply voltage VDDH, a gate coupled to the first node N31 and a source providing the second power supply voltage VDDL.

Therefore, the target voltage generation unit 450b (i.e., the plurality of diodes D1, . . . , Dr) may provide the gate of the power transistor PT with a target voltage Vr corresponding to a sum of threshold voltages of each of the plurality of diodes D1, . . . , Dr, at the first node N31, and the power transistor PT may adjust a level of the second power supply voltage VDDL based on the target voltage Vr.

In example embodiments, the power transistor PT may correspond to a native NMOS transistor having substantially zero threshold voltage, and the level of the second power supply voltage VDDL may be the same as a level of the target voltage Vr.

In example embodiments, the power transistor PT may correspond to an NMOS transistor having non-zero threshold voltage, and the level of the second power supply voltage VDDL may correspond to a value obtained by subtracting a threshold voltage of the NMOS transistor from the level of the target voltage Vr.

The level of the target voltage Vr may be determined based on a number of the plurality of diodes D1, . . . , Dr.

The current mirror circuit 440 may include a first p-channel metal-oxide semiconductor (PMOS) transistor 441 and a second PMOS transistor 442.

The first PMOS transistor 441 may have a source coupled to the first power supply voltage VDDH, a gate coupled to the current source 445 at a second node N32 and a drain coupled to the current source 445 at the second node N32. The second PMOS transistor 442 may have a source coupled to the first power supply voltage VDDH, a drain coupled to the first node N31 and a gate coupled to the second node N32 and may provide mirrored current Im to the first node N31.

Figure 9A:
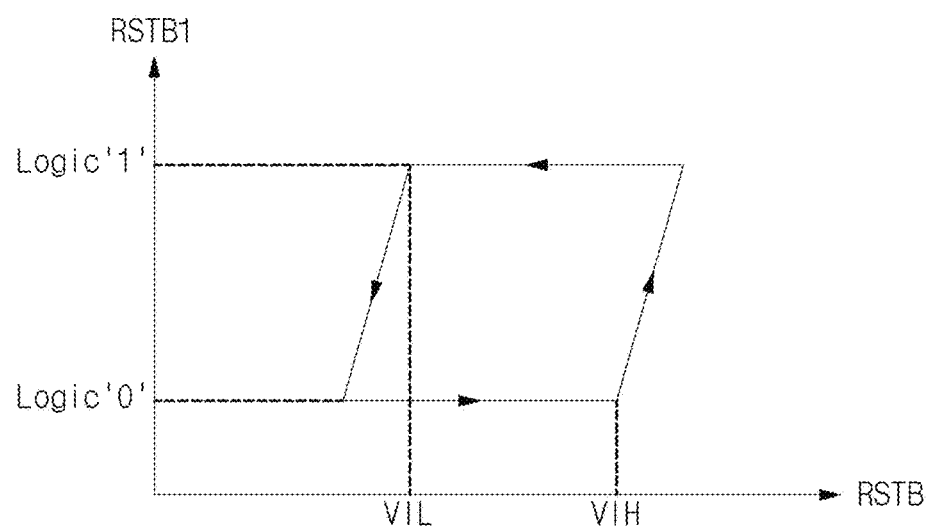
FIG. 9A is a graph illustrating an example operation of a first Schmitt-trigger buffer according to example embodiments.

FIG. 9A is a graph illustrating an example operation of a first Schmitt-trigger buffer, according to example embodiments.

Referring to FIGS. 7 and 9A, the first Schmitt-trigger buffer 460a may have a hysteresis characteristic and may output the first inverted reset signal RSTB1 by Schmitt-triggering the inverted reset signal RSTB supplied as an input to the first Schmitt-trigger buffer 460a. Because the Schmitt-trigger buffer 460a operates based on the second power supply voltage VDDL, a level of a logic high (Logic '1') voltage VIH and a level of a logic low (Logic '0') voltage VIL of the first Schmitt-trigger buffer 460a are independent from the first power supply voltage VDDH. In addition, even when an extra power supply voltage is not provided to the first Schmitt-trigger buffer 460a, the first Schmitt-trigger buffer 460a may operate stably because the first Schmitt-trigger buffer 460a operates based on the second power supply voltage VDDL provided from the low voltage generator 430a.

Because the level of the logic high voltage VIH and the level of the logic low voltage VIL of the first Schmitt-trigger buffer 460a are independent from the first power supply voltage VDDH, the input buffer circuit 420 including the low voltage generator 430a of FIG. 8A or the low voltage generator 430b of FIG. 8B operates stably even when a voltage level of the first power supply voltage VDDH decreases or increases.

Figure 9B:
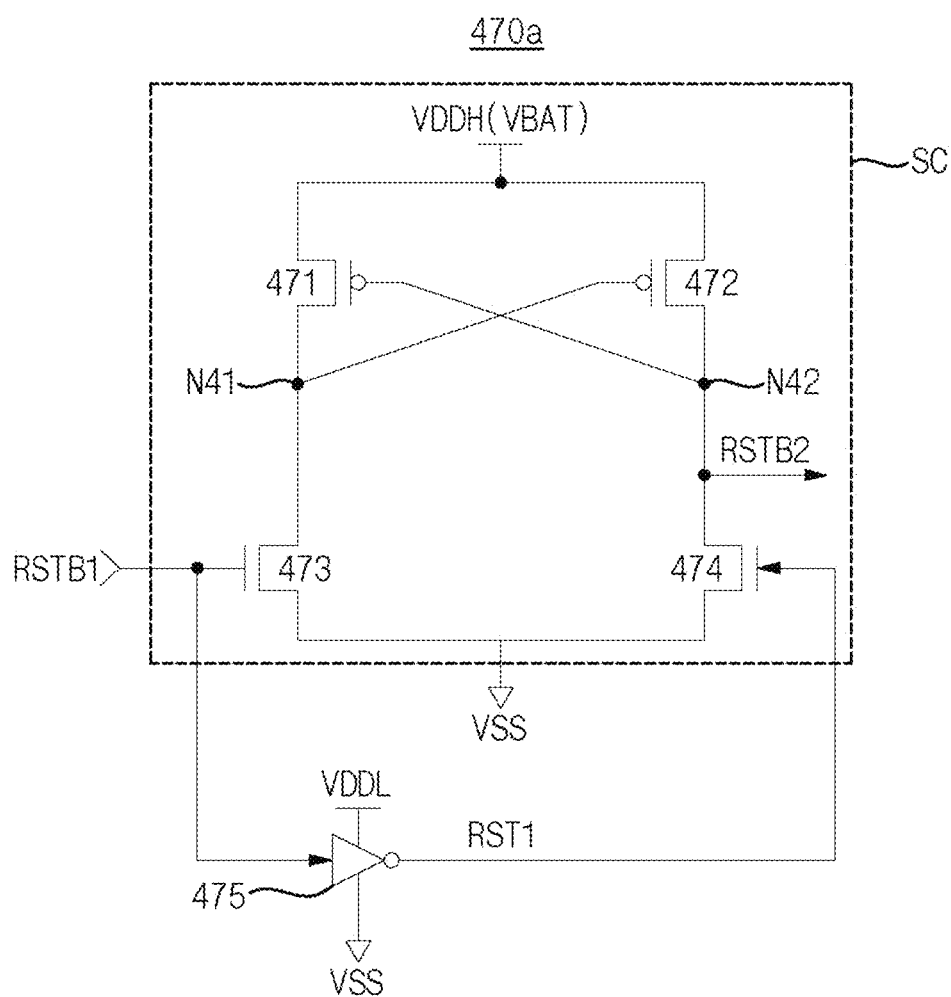
FIG. 9B is a circuit diagram illustrating an example of a first dual-supply level shifter in the input buffer circuit of FIG. 7, according to example embodiments.

FIG. 9B is a is a circuit diagram illustrating an example of the first dual-supply level shifter 470a in the input buffer circuit of FIG. 7, according to example embodiments.

Referring to FIG. 9B, the first dual-supply level shifter 470a may include an inverter 475 and a shifting circuit SC.

The inverter 475 may be coupled between the second power supply voltage VDDL and the ground voltage VSS and may output the first reset signal RST1 by inverting the first inverted reset signal RSTB1.

The shifting circuit SC may be coupled between the first power supply voltage VDDH and the ground voltage VSS, may receive the first inverted reset signal RSTB1 and the first reset signal RST1 and may output the second inverted reset signal RSTB2 by shifting a logic high level of the first inverted reset signal RSTB1 from the second voltage level to the first voltage level.

The shifting circuit SC may include a first PMOS transistor 471, a second PMOS transistor 472, a first NMOS transistor 473 and a second NMOS transistor 474.

The first PMOS transistor 471 may be coupled between the first power supply voltage VDDH and a first node N41, and may have a gate coupled to a second node N42. The second PMOS transistor 472 may be coupled between the first power supply voltage VDDH and the second node N42, and may have a gate coupled to the first node N41; that is, the first PMOS transistor 471 and the second PMOS transistor 472 may be connected in a cross-coupled configuration, which may increase the gain of the dual-supply level shifter 470a.

The first NMOS transistor 473 may be coupled between the first node N41 and the ground voltage VSS, and may have a gate receiving the first inverted reset signal RSTB1. The second NMOS transistor 474 may be coupled between the second node N42 and the ground voltage VSS, and may have a gate receiving the first reset signal RST1.

When the first inverted reset signal RSTB1 has a logic high level, the first NMOS transistor 473 is turned-on and the first node N41 is discharged to the ground voltage VSS. In addition, the second PMOS transistor 472 is turned-on based on a voltage level of the first node N41 and the voltage level of the second inverted reset signal RSTB2 is shifted to the first voltage level of the first power supply voltage VDDH.

When the first inverted reset signal RSTB1 has a logic low level, the second NMOS transistor 474 is turned-on, the second node N42 is discharged to the ground voltage VSS and the voltage level of the second inverted reset signal RSTB has a level of the ground voltage VSS.

Therefore, when the first inverted reset signal RSTB1 swings between the second power supply voltage VDDL and the ground voltage VSS, the second inverted reset signal RSTB2 swings between the first power supply voltage VDDH and the ground voltage VSS.

Figure 10:
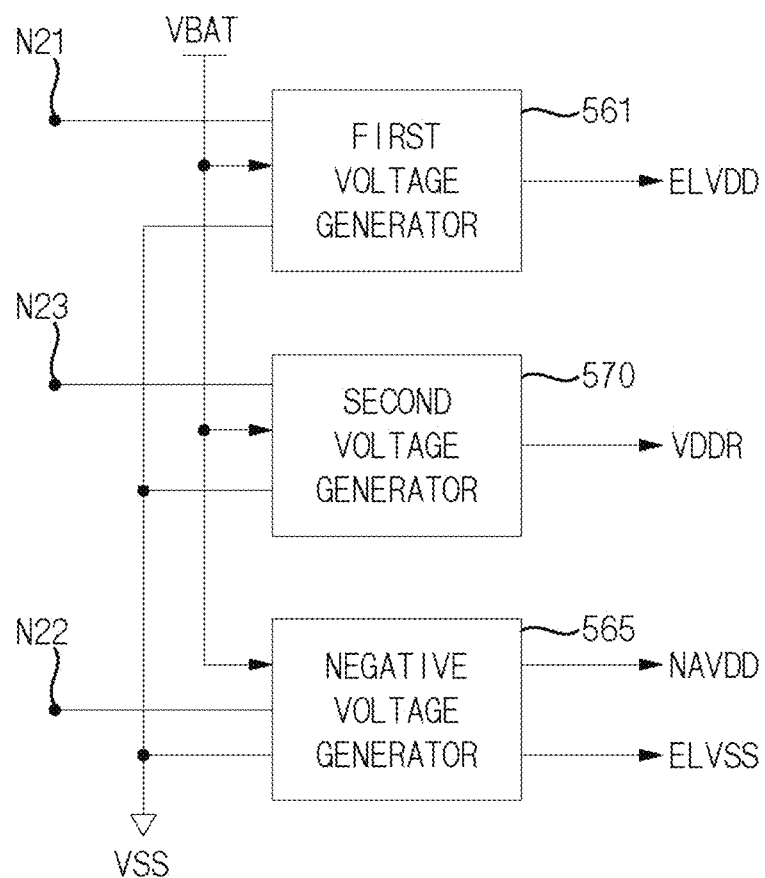
FIG. 10 is a schematic block diagram illustrating a portion of the PMIC of FIG. 5, according to example embodiments.

FIG. 10 is a schematic block diagram illustrating a portion of the PMIC 400 of FIG. 5, according to example embodiments.

Referring to FIGS. 5, 6 and 10, the first voltage generator 561 may be coupled to the node N21 and may generate the high power supply voltage ELVDD based on the battery voltage VBAT stored in the inductor 411. The second voltage generator 570 may be coupled to the node N23 and may generate the first driving voltage VDDR based on the battery voltage VBAT stored in the inductor 413. The negative voltage generator 565 may be coupled to the node N22 and may generate the second driving voltage NAVDD and the low power supply voltage ELVSS based on the ground voltage VSS stored in the inductor 412.

Figure 11:
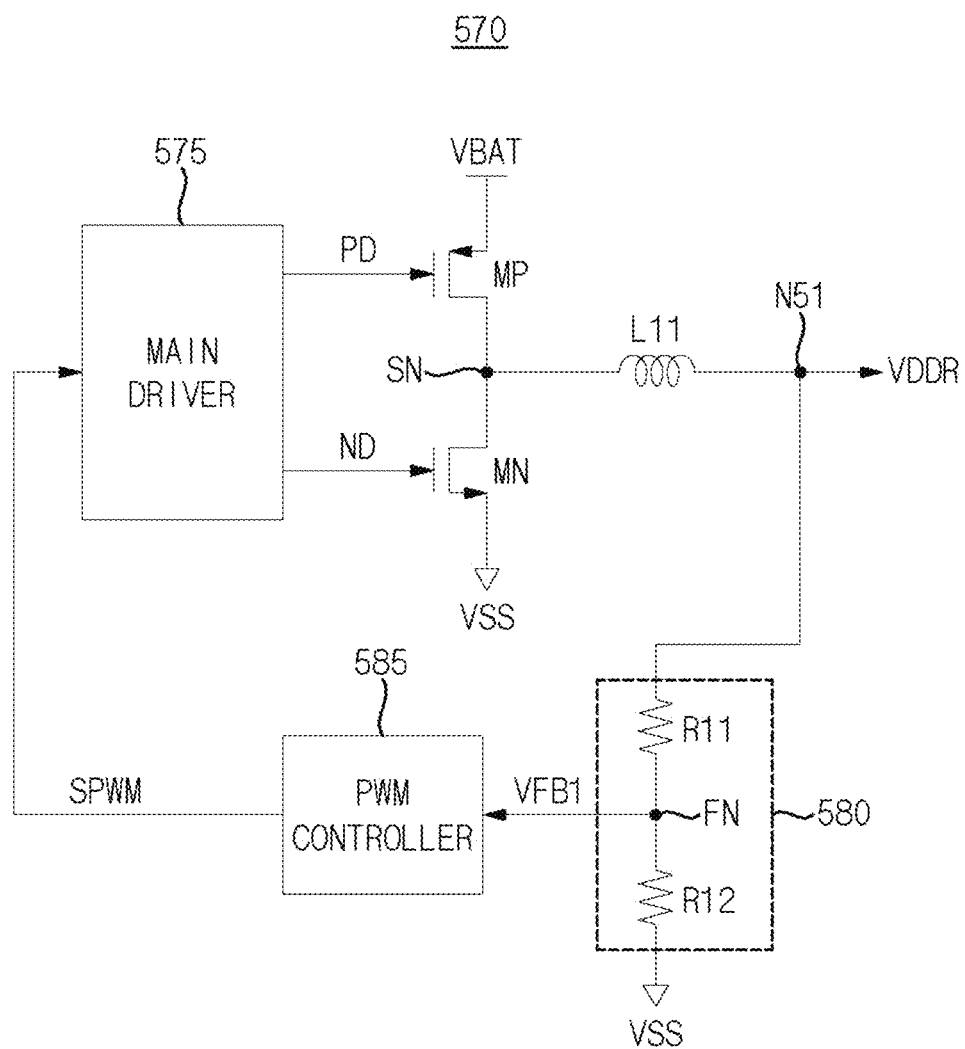
FIG. 11 is a schematic block diagram illustrating an example of a second voltage generator in the PMIC in FIG. 10, according to example embodiments.

FIG. 11 is a schematic block diagram illustrating an example of the second voltage generator 570 in the PMIC 400 shown in FIG. 10, according to example embodiments.

Referring to FIG. 11, the second voltage generator 570 may include a main driver 575, a first power switch MP, a second power switch MN, an inductor L11, a feedback circuit 580 and a pulse width modulation (PWM) controller 585.

The first power switch MP may be coupled between the battery voltage VBAT and a switching node SN and may include a PMOS transistor that has a source coupled to the battery voltage VBAT, a gate receiving a first driving control signal PD and a drain coupled to the switching node SN. The second power switch MN may be coupled between the switching node SN and the ground voltage VSS. The second power switch MP may include an NMOS transistor which has a drain coupled to the switching node SN, a gate receiving a second driving control signal ND and a source coupled to the ground voltage VSS.

An energy based on the battery voltage VBAT may be stored in the inductor L11 by switching operation of the first power switch MP and the second power switch MN and the energy stored in the inductor L11 may be provided as the first driving voltage VDDR at an output node N51.

The PWM controller 585 may generate a PWM signal SPWM based on a feedback voltage VFB1 which is proportional to the first driving voltage VDDR. The PWM controller 585 may generate the PWM signal SPWM by performing a PWM on the feedback voltage VFB1 supplied as an input to the PWM controller 585. The PWM signal SPWM may be supplied as an input to the main driver 575.

The feedback circuit 580 may generate the feedback voltage VFB1 which is proportional to the first driving voltage VDDR and may provide the feedback voltage VFB1 to the PWM controller 585. The feedback circuit 580 may include dividing resistors R11 and R12 connected in series between the output node N51 and the ground voltage VSS and the dividing resistors R11 and R12 may be connected to each other at a feedback node FN in a voltage divider configuration. For example, as illustrated in FIG. 11, the feedback circuit 580 may generate the feedback voltage VFB1 corresponding to a ratio of resistance values of the dividing resistors R11 and R12, but example embodiments are not limited thereto.

Figure 12:
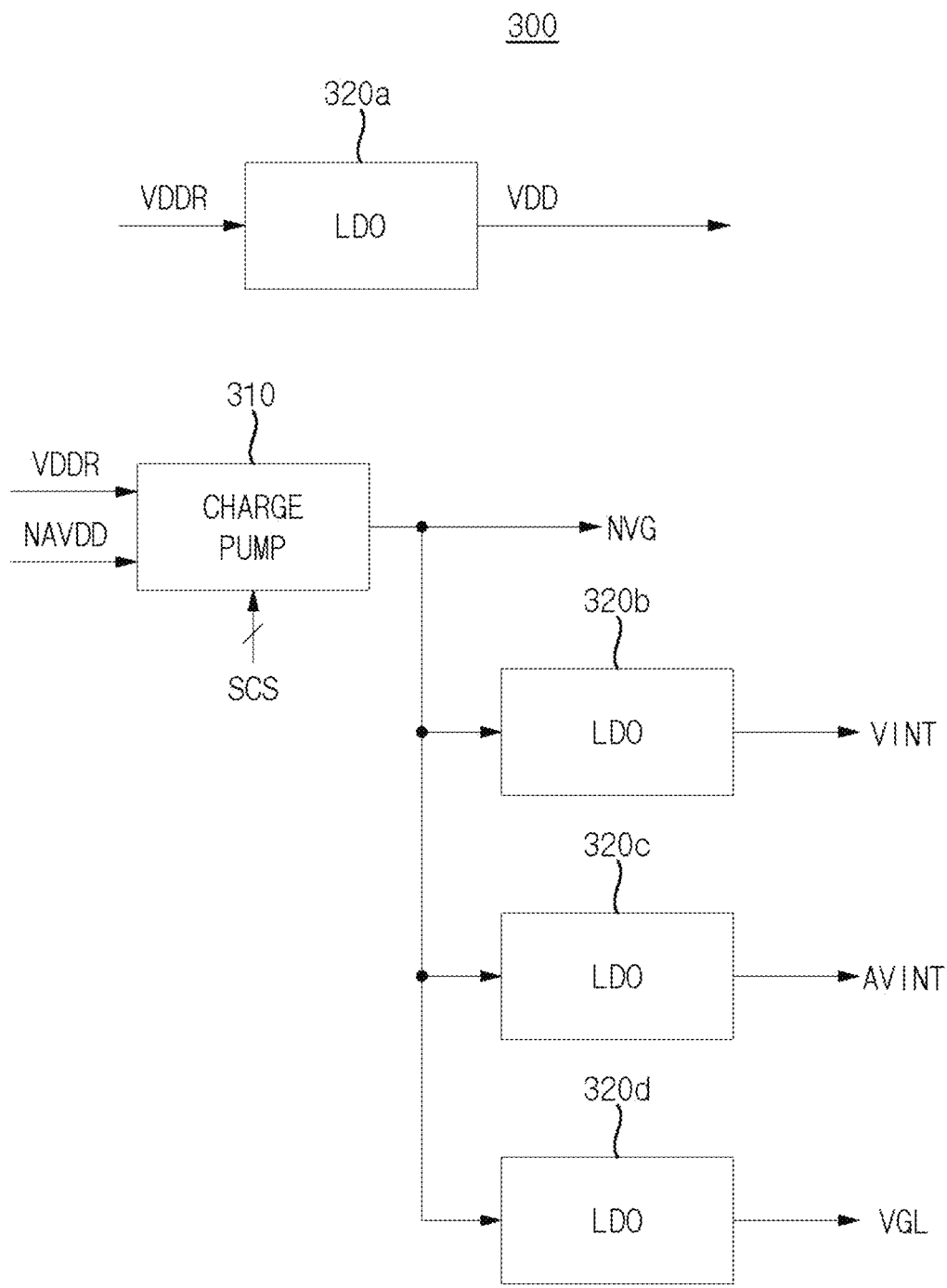
FIG. 12 is a schematic block diagram illustrating an example of a voltage generator in the OLED device in FIG. 1, according to example embodiments.

FIG. 12 is a schematic block diagram illustrating an example of the voltage generator 300 in the OLED device 100 shown in FIG. 1, according to example embodiments.

Referring to FIG. 12, the voltage generator 300 may include a charge pump 310 and a plurality of low drop-out (LDO) regulators 320a, 320b, 320c and 320d.

The charge pump 310 may generate the negative voltage NVG based on the first driving voltage VDDR, the second driving voltage NAVDD and switching control signals SCS provided to the charge pump 310.

The LDO regulator 320a may generate the first operating voltage VDD based on the first driving voltage VDDR. Each of the LDO regulators 320b, 320c and 320d may generate a respective one of the first initialization voltage VINT, the second initialization voltage AVINT, and the second operating voltage VGL based on the negative voltage NVG.

The switching control signals SCS may be included in the power control signal PCTL in FIG. 1 or the timing controller 130 may provide the switching control signals SCS to the voltage generator 300.

Figure 13:
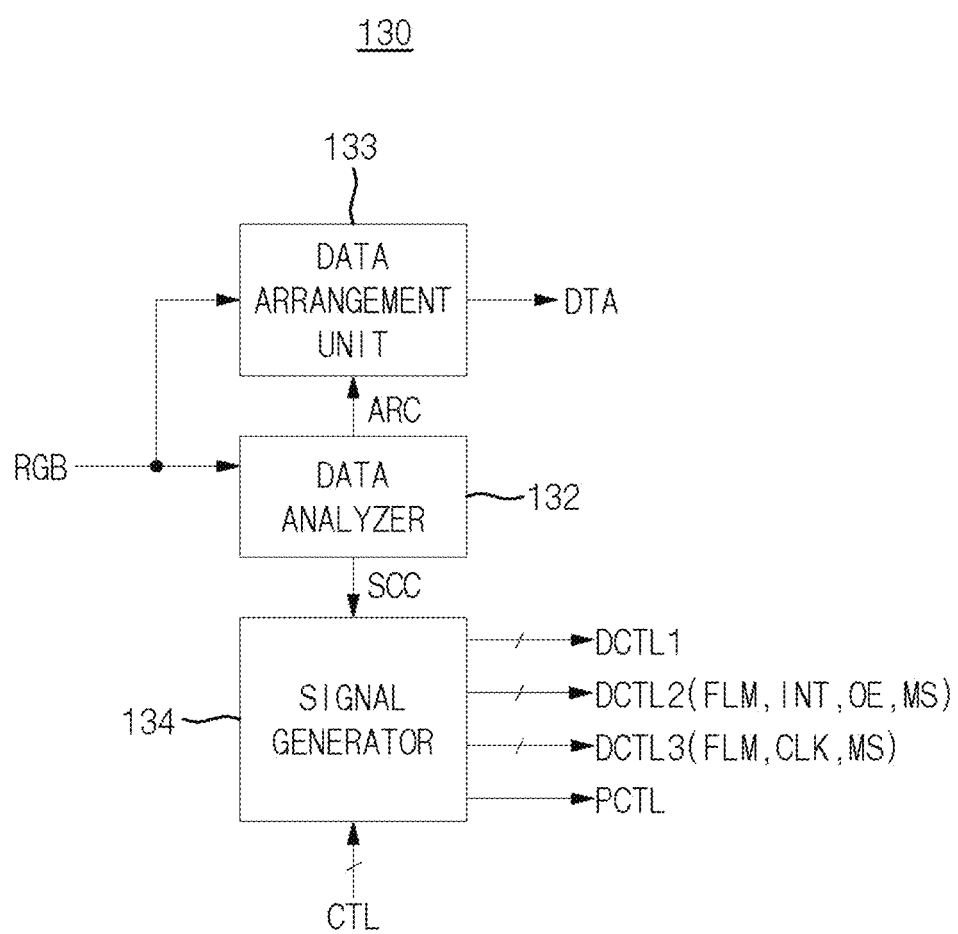
FIG. 13 is a schematic block diagram illustrating an example of a timing controller in the OLED display device of FIG. 1, according to example embodiments.

FIG. 13 is a schematic block diagram illustrating an example of the timing controller 130 in the OLED display device 100 of FIG. 1, according to example embodiments.

Referring to FIG. 13, the timing controller 130 may include a data analyzer 132, a data arrangement unit 133 and a signal generator 134.

The data analyzer 132 may generate an arrangement control signal ARC and a scan control sequence signal SCC based on the input image data RGB. The data analyzer 132 may provide the arrangement control signal ARC to the data arrangement unit 133 and the scan control signal SCC to the signal generator 134.

The data analyzer 132 may analyze grey levels of the input image data RGB per each data line to generate the arrangement control signal ARC. The data arrangement unit 133 may rearrange the input image data RGB, which may be supplied as an input to the data arrangement unit 133, according to the arrangement control signal ARC to output the data signal DTA.

The signal generator 134 may generate the first driving control signal DCTL1 that controls the data driver circuit 150 (FIG. 1), the second driving control signal DCTL2 that controls the scan driver circuit 200 (FIG. 1) and the third driving control signal DCTL3 that controls the emission driver circuit 260 (FIG. 1) based on the control signal CTL and the scan control signal SCC.

The signal generator 134 may generate the power control signal PCTL that controls the voltage generator 300, in response to the control signal CTL. The second driving control signal DCTL2 may include a starting signal FLM (frame line mark), a plurality of initialization signal INT and a plurality of output enable signal OE and a mode signal MS associated with a scan mode. The third driving control signal DCTL3 may include the starting signal FLM, a clock signal CLK and the mode signal MS.

Figure 14:
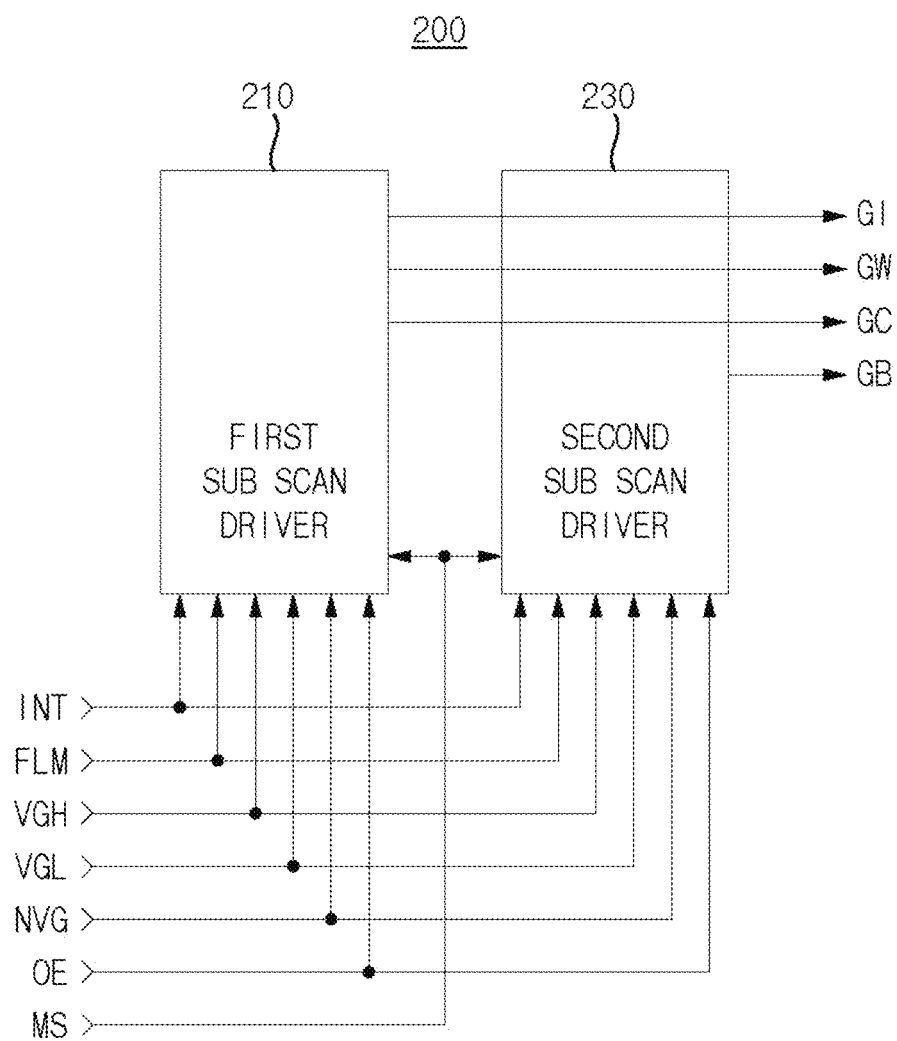
FIG. 14 is a schematic block diagram illustrating an example of a scan driver circuit in the OLED display device of FIG. 1, according to example embodiments.

FIG. 14 is a schematic block diagram illustrating an example of the scan driver circuit 200 in the OLED display device 100 of FIG. 1, according to example embodiments.

Referring to FIG. 14, the scan driver circuit 200 may include a first sub scan driver 210 and a second sub scan driver 230.

The first sub scan driver 210 may receive an initialization signal INT, the starting signal FLM, the first sub driving voltage VGH, the second sub driving voltage VGL, the negative voltage NVG, an output enable signal OE and a mode signal MS, may generate the first scan signal GI, the second scan signal GW and the third scan signal GC based on the initialization signal INT, the starting signal FLM, the first sub driving voltage VGH, the second sub driving voltage VGL, the negative voltage NVG, the output enable signal OE and the mode signal MS and may determine scan on-time of each of the first scan signal GI, the second scan signal GW and the third scan signal GC generated by the first sub scan driver 210.

The second sub scan driver 230 may receive the initialization signal INT, the starting signal FLM, the first sub driving voltage VGH, the second sub driving voltage VGL, the negative voltage NVG, the output enable signal OE and the mode signal MS, may generate the fourth scan signal GB based on the initialization signal INT, the starting signal FLM, the first sub driving voltage VGH, the second sub driving voltage VGL, the negative voltage NVG, the output enable signal OE and the mode signal MS and may determine scan on-time of the fourth scan signal GB.

Figure 15:
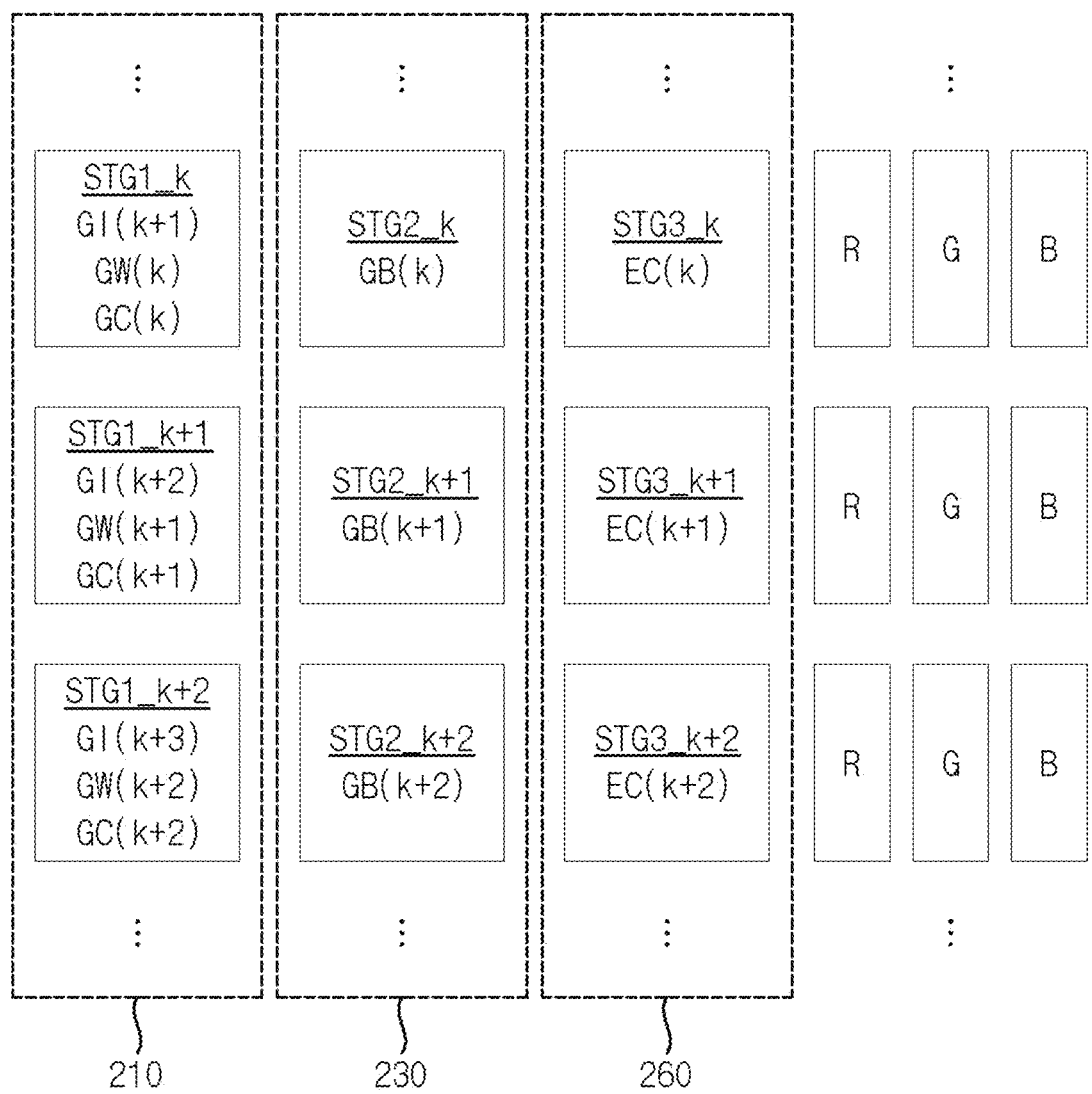
FIG. 15 is a schematic block diagram illustratings the scan driver circuit of FIG. 14 combined with an emission driver circuit in FIG. 1, according to example embodiments.

FIG. 15 is a schematic block diagram illustrating the scan driver circuit 200 of FIG. 14 combined with the emission driver circuit 260 shown in FIG. 1, according to example embodiments.

In FIG. 15, some stages of a plurality of stages in the first sub scan driver 210 and the sub second scan driver 230 and some stages of a plurality of stages in the emission driver circuit 260 shown in FIG. 1 are illustrated.

Referring to FIG. 15, the first sub scan driver 210 may include stages STG1_$k$, STG1_$k$+1 and STG1_$k$+2, the second sub scan driver 230 may include stages STG2_$k$, STG2_$k$+1 and STG2_$k$+2, and the emission driver circuit 260 may include stages STG3_$k$, STG3_$k$+1 and STG3_$k$+2. Here, k is a natural number and may be one of 1~n.

Each of the stages STG2_$k$, STG2_$k$+1 and STG2_$k$+2 in the second sub scan driver 230 may generate a respective one of fourth scan signals GB (k), GB (k+1) and GB (k+2) associated with corresponding pixel rows of the pixels 111 in FIG. 1, and each of the stages STG3_$k$, STG3_$k$+1 and STG3_$k$+2 in the emission driver circuit 260 may generate a respective one of emission control signals EC (k), EC (k+1) and EC (k+2) associated with corresponding pixel rows of the pixels 111 in FIG. 1.

The stage STG1_$k$ in the first sub scan driver 210 may generate a first scan signal GI(k+1) associated with a (k+1)-th pixel row, a second scan signal GW (k) associated with a k-th pixel row and a third scan signal GC (k) associated with the k-th pixel row.

The stage STG1_$k$+1 in the first sub scan driver 210 may generate a first scan signal GI(k+2) associated with a (k+2)-th pixel row, a second scan signal GW (k+1) associated with the (k+1)-th pixel row and a third scan signal GC (k+1) associated with the (k+1)-th pixel row. The stage STG1_$k$+2 in the first sub scan driver 210 may generate a first scan signal GI(k+3) associated with a (k+3)-th pixel row, a second scan signal GW (k+2) associated with the (k+2)-th pixel row and a third scan signal GC (k+2) associated with the (k+2)-th pixel row.

That is, the first sub scan driver 210 may be fabricated by merging circuits associated with the second scan signal GW and the third scan signal GC or may be fabricated by merging circuits associated with the first scan signal GI, the second scan signal GW and the third scan signal GC. Therefore, an occupied area by the first sub scan driver 210 may be reduced.

In FIG. 15, blocks R, G and B represent pixels displaying corresponding colors red, green and blue, respectively.

Figure 16:
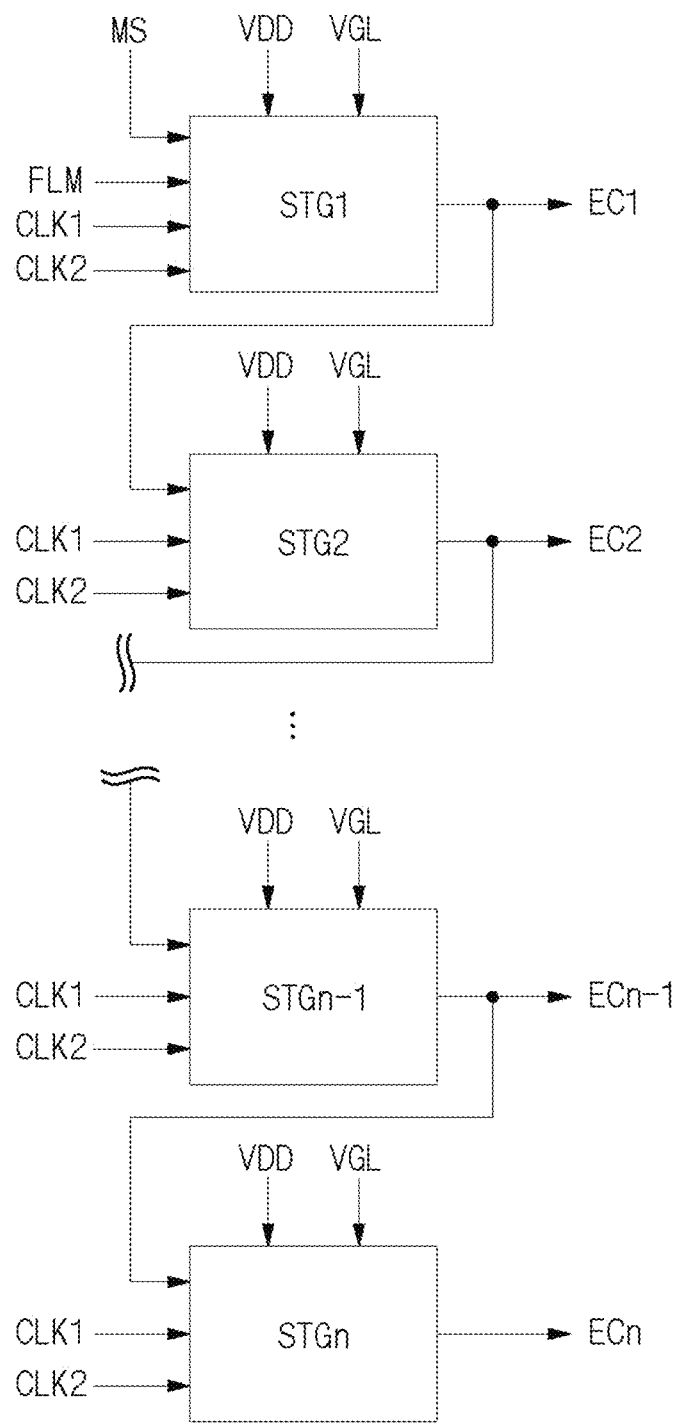
FIG. 16 is a schematic block diagram illustrating an emission driver circuit shown in the OLED display device of FIG. 1, according to example embodiments.

FIG. 16 is a schematic block diagram illustrating the emission driver circuit 260 shown in the OLED display device 100 of FIG. 1, according to example embodiments.

Referring to FIG. 16, the emission driver circuit 260 may include a plurality of stages STG1~STGn connected to each other one after another (i.e., in a serial configuration, such an output of one stage is connected to an input of a next subsequent stage) to sequentially output the emission control signals EC1~ECn.

The stages STG1~STGn are connected to the emission control lines EL1~ELn, respectively, (see FIG. 1) and sequentially output the emission control signals EC1~ECn. The emission control signals EC1~ECn may overlap each other during a predetermined period.

Each of the stages STG1~STGn receives the second operating voltage VGL and the first operating voltage VDD having the voltage level higher than that of the second operating voltage VGL. In addition, each of the stages STG1~STGn receives the first clock signal CLK1 and the second clock signal CLK2 and one or more of the stages STG1~STGn (e.g., the first stage STG1) receive the mode signal MS. The mode signal MS may determine a number of horizontal periods included in the non-emission interval. That is, the mode signal MS may determine a time interval of the non-emission interval.

Hereinafter, the emission control signals EC1~ECn output through the emission control lines EL1~ ELn are referred to as first to n-th emission control signals.

Among the stages STG1~STGn, the first stage STG1 is driven in response to the starting signal FLM. In detail, the first stage STG1 receives the first driving voltage VDD and the second driving voltage VGL and generates the first emission control signal EC1 in response to the starting signal FLM, the first clock signal CLK1, the second clock signal CLK2 and the mode signal MS. The first emission control signal EC1 is applied to the pixels in the pixel row through the first emission control line EL1.

The stages STG1~STGn are connected to each other one after another and are sequentially driven. In detail, a present stage is connected to an output electrode of a pervious stage and receives the emission control signal output from the previous stage. The present stage is driven in response to the emission control signal provided from the previous stage.

For example, a second stage STG2 may receive the first emission control signal EC1 output from the first stage STG1 and is driven in response to the first emission control signal EC1. The second stage STG2 receives the first driving voltage VDD and the second driving voltage VGL and generates the second emission control signal EC2 in response to the first emission control signal EC1, the first clock signal CLK1, and the second clock signal CLK2. The second emission control signal EC2 is applied to the pixels in the pixel row through the second emission control line EL2. The other stages STG3 to STGn are driven in the same way as the second stage STG2, and thus details thereof will not be repeated.

Figure 17:
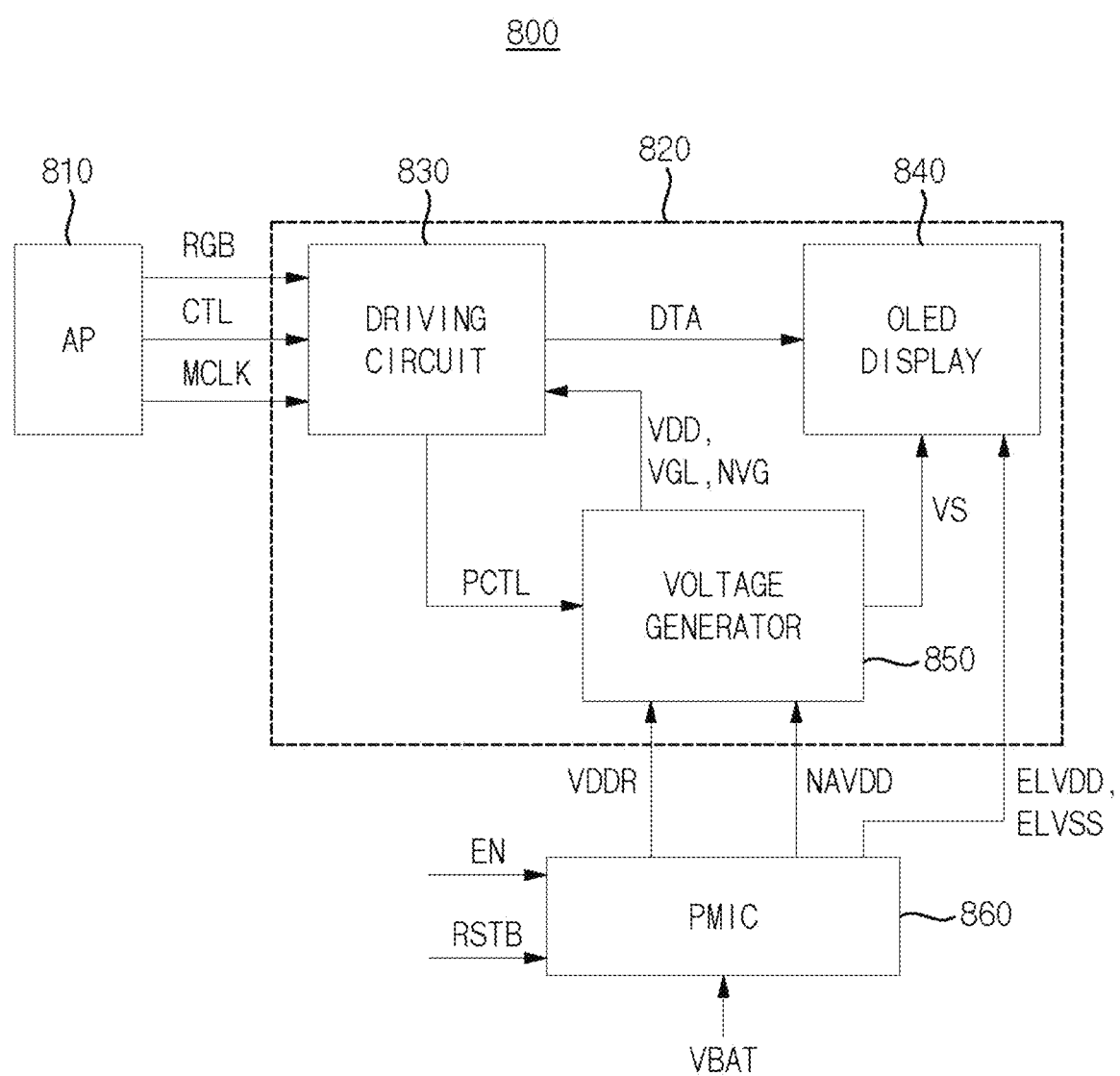
FIG. 17 is a schematic block diagram illustrating at least a portion of an example of a display system, according to example embodiments.

FIG. 17 is a schematic block diagram illustrating an example of a display system according to example embodiments.

Referring to FIG. 17, a display system 800 may include an application processor (AP) 810, an OLED display device 820 and a PMIC 860.

The OLED display device 820 may include a driving circuit 830, a display panel (OLED display) 840 and a voltage generator 850.

The voltage generator 850 may provide initialization voltages VS to the display panel 840 in response to a power control signal PCTL from the driving circuit 830. The voltage generator 850 may generate a first driving voltage VDD, a second driving voltage VGL and a negative voltage NVG based on a first driving voltage VDDR and a second driving voltage NAVDD and may provide the first operating voltage VDD, the second operating voltage VGL and the negative voltage NVG to a scan driver circuit of the driving circuit 830. The voltage generator 850 may include a plurality of LDO regulators (e.g., see FIG. 12) which generate the first operating voltage VDD, the second operating voltage VGL and the negative voltage NVG, respectively.

The scan driver circuit (e.g., 200 in FIG. 1) may generate scan signals to be provided to the display panel 840 based on the first operating voltage VDD, the second operating voltage VGL and the negative voltage NVG.

The driving circuit 830 and the voltage generator 850 may be incorporated into one integrated circuit (IC).

The PMIC 860 may generate a high power supply voltage ELVDD and a low power supply voltage ELVSS based on a battery voltage VBAT and may provide the high power supply voltage ELVDD and the low power supply voltage ELVSS to the display panel 840. In addition, the PMIC 860 may generate the first driving voltage VDDR and the second driving voltage NAVDD based on the battery voltage VBAT and may provide the first driving voltage VDDR and the second driving voltage NAVDD to the voltage generator 850.

The PMIC 860 may receive an inverted reset signal RSTB and an enable signal EN, and may provide a second inverted reset signal and a second enable signal to control logic located within the PMIC 860 by buffering the inverted reset signal RSTB and the enable signal EN. The PMIC 860 may include an input buffer circuit that generates the second inverted reset signal and the second enable signal by Schmitt-triggering the inverted reset signal RSTB and the enable signal EN based on a second power supply voltage that is being independent from a variation of the battery voltage VBAT. The input buffer circuit may employ the input buffer circuit 420 of FIG. 7.

The OLED display system 800 may be a portable device, such as, but not limited to, a laptop, a cellular phone, a smart phone, a personal computer (PC), a personal digital assistant (PDA), a portable multi-media player (PMP), an MP3 player, an automotive navigation system, etc.

The application processor 810 provides an image signal RGB, a control signal CTL and a main clock signal MCLK to the OLED display device 820, and the driving circuit 830 may provide data DTA to the display panel 840.

Figure 18:
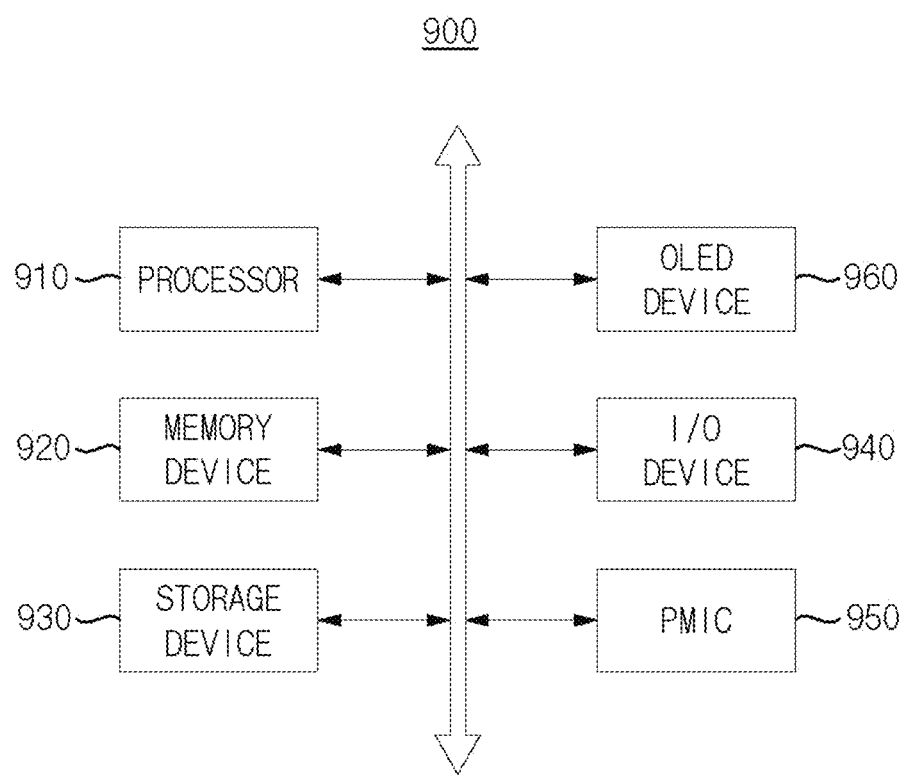
FIG. 18 is a schematic block diagram illustrating an electronic device including an OLED display device, according to example embodiments.

FIG. 18 is a block diagram illustrating an electronic device including an OLED display device according to example embodiments.

Referring to FIG. 18, an electronic device 900 includes a processor 910, a memory device 920, a storage device 930, an input/output (I/O) device 940, a PMIC 950, and an OLED display device 960. The processor 910, the memory device 920, the storage device 930, the input/output (I/O) device 940, the PMIC 950, and the OLED display device 960 may be interconnected via a communication bus or other connection arrangement. The electronic device 900 may further include a plurality of ports for communicating with a video card, a sound card, a memory card, a universal serial bus (USB) device, other electronic systems, etc. (not explicitly shown).

The processor 910 may perform various computing functions or tasks. The processor 910 may be for example, a microprocessor, a central processing unit (CPU), etc. The processor 910 may be connected to other components via an address bus, a control bus, a data bus, etc. Further, the processor 910 may be coupled to an extended bus such as a peripheral component interconnection (PCI) bus.

The memory device 920 may store data for operations of the electronic system 900. For example, the memory device 920 may include at least one non-volatile memory device such as a flash memory device and/or at least one volatile memory device such as a dynamic random access memory (DRAM) device, a static random access memory (SRAM) device, a mobile dynamic random access memory (mobile DRAM) device, etc.

The storage device 930 may be, for example, a solid-state drive (SSD) device, a hard disk drive (HDD) device, a CD-ROM device, etc. The I/O device 940 may be, for example, an input device such as a keyboard, a keypad, a mouse, a touch screen, etc., and/or an output device such as a printer, a speaker, etc. The power supply 950 may supply power for operations of the electronic system 900. The organic light emitting display device 960 may communicate with other components via the buses or other communication links.

The OLED display device 960 may employ the mobile device 50 shown in FIG. 1. Therefore, the OLED display device 960 may include a driving circuit and a display panel and the driving circuit may include a data driver circuit, a scan driver circuit, a voltage generator and a PMIC.

The PMIC 950 may include an input buffer circuit. The input buffer circuit may receive an inverted reset signal and an enable signal from an external host and may provide a second inverted reset signal and a second enable signal to a control logic located at an inside of the PMIC by buffering the inverted reset signal and the enable signal. The input buffer circuit may generate the second inverted reset signal and the second enable signal by Schmitt-triggering the inverted reset signal and the enable signal based on a second power supply voltage that is being independent from a variation of a battery voltage. The input buffer circuit may employ the input buffer circuit 420 of FIG. 7.

The electronic device 900 may be a mobile electronic device including the OLED display device 960 such as a smart phone.

Figure 19:
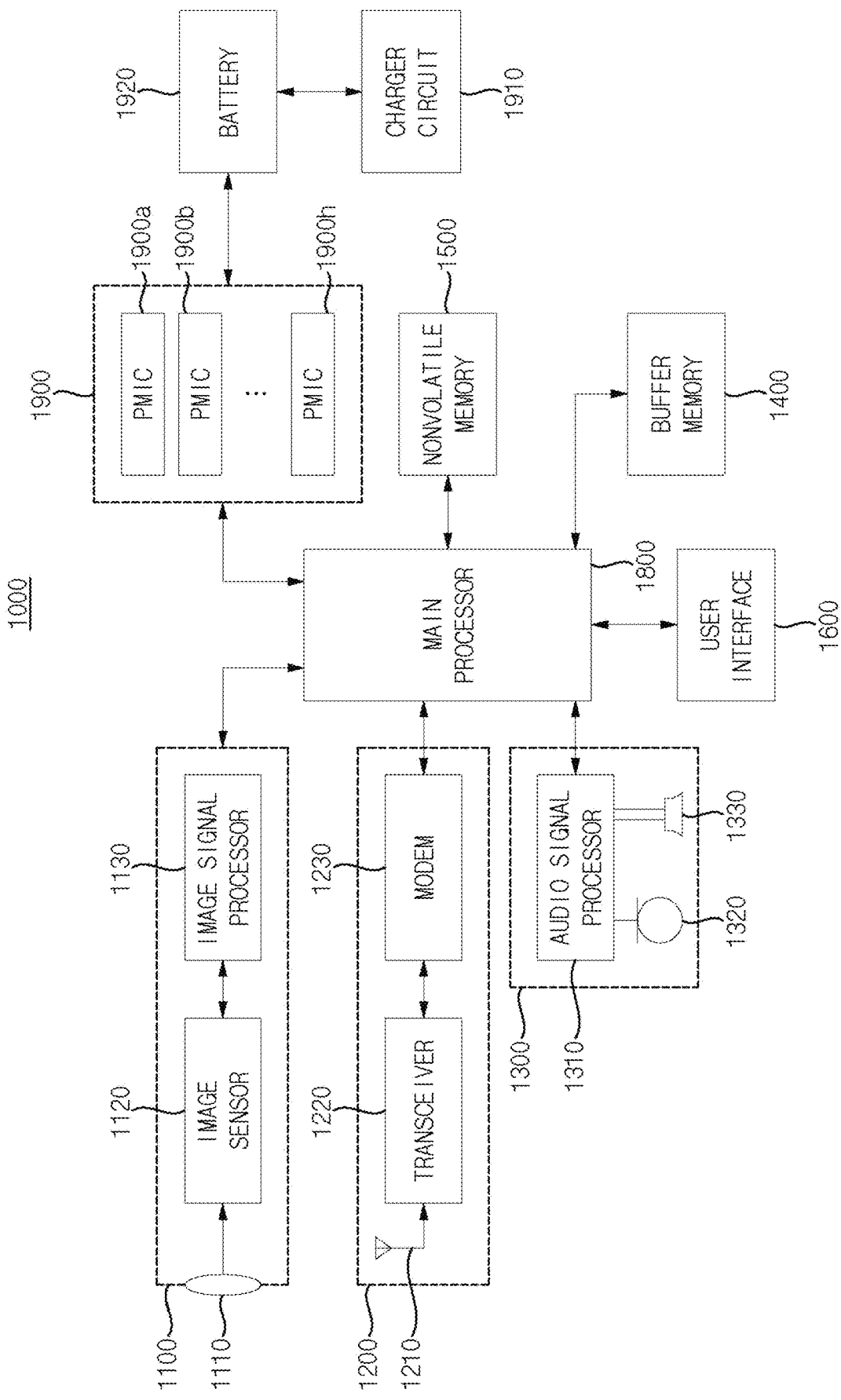
FIG. 19 is a schematic block diagram illustrating an example of an electronic device according to example embodiments.

FIG. 19 is a block diagram illustrating an example of an electronic device according to example embodiments.

Referring to FIG. 19, an electronic device 1000 may include various electronic circuits. For example, the electronic circuits of the electronic device 1000 may include an image processing block 1100, a communication block 1200, an audio processing block 1300, a buffer memory 1400, a nonvolatile memory 1500, a user interface 1600, a main processor 1800, a power management device 1900, and a charger circuit 1910.

The electronic device 1000 may be implemented with any computing device or any mobile/portable device, such as a mobile phone, a smart phone, a tablet computer, a laptop computer, a personal digital assistants (PDA), an enterprise digital assistant (EDA), a portable multimedia player (PMP), a digital camera, a portable game console, a music player, a camcorder, a video player, a navigation device, a wearable device, an internet of things (IoT) device, an internet of everything (IoE) device, an e-book, a virtual reality (VR) device, an augmented reality (AR) device, a robotic device, etc.

For example, the electronic device 1000 may be connected with a battery 1920, and the battery 1920 may supply a power that is used for an operation of the electronic device 1000. However, the present disclosure is not limited to this example. For example, a power that is supplied to the electronic device 1000 may be provided from a power source different from the battery 1920.

The image processing block 1100 may receive a light through a lens 1110. An image sensor 1120 and an image signal processor 1130 included in the image processing block 1100 may generate image information associated with an external object, based on the received light from the lens 1110.

The communication block 1200 may exchange signals (i.e., transmit and/or receive signals) with an external device/system through an antenna 1210. A transceiver 1220 and a MODEM (Modulator/Demodulator) 1230 of the communication block 1200 may process signals, which are exchanged with the external device/system, depending on one or more of various wired/wireless communication protocols.

The audio processing block 1300 may process sound information by using an audio signal processor 1310. The audio processing block 1300 may receive an audio input through a microphone 1320 or may output audio through a speaker 1330.

The buffer memory 1400 may store data that are used for an operation of the electronic device 1000. For example, the buffer memory 1400 may temporarily store data processed or to be processed by the main processor 1800. For example, the buffer memory 1400 may include a volatile memory such as a static random access memory (SRAM), a dynamic RAM (DRAM), or a synchronous DRAM (SDRAM), and/or a nonvolatile memory such as a phase-change RAM (PRAM), a magneto-resistive RAM (MRAM), a resistive RAM (ReRAM), or a ferroelectric RAM (FRAM).

The nonvolatile memory 1500 may store data regardless of whether power is supplied. For example, the nonvolatile memory 1500 may include at least one of various nonvolatile memories such as a flash memory, a PRAM, an MRAM, a ReRAM, and a FRAM. For example, the nonvolatile memory 1500 may include a removable memory such as a secure digital (SD) card or a solid state drive (SSD), and/or an embedded memory such as an embedded multimedia card (eMMC).

The user interface 1600 may enable communication between a user and the electronic device 1000. For example, the user interface 1600 may include an input interface for receiving an input from the user and an output interface for providing information to the user.

The main processor 1800 may control overall operation of the components of the electronic device 1000. The main processor 1800 may perform various operations for the purpose of operating the electronic device 1000. For example, the main processor 1800 may be implemented with an operation processing device/circuit, which includes one or more processor cores, such as a general-purpose processor, a special-purpose processor, an application processor, or a microprocessor.

The power management device 1900 and the charger circuit 1910 may supply a power which is used for operating the electronic device 1000. For example, the power management device 1900 may be implemented with a plurality of PMICs 1900a, 1900b, . . . , 1900h. This will be described with reference to FIG. 20. Here, h may be a natural number greater than two. The charger circuit 1910 may be configured to supply power to the battery for charging the battery 1920; a charging profile of the charger circuit 1910 may vary according to characteristics of the battery 1920.

Figure 20:
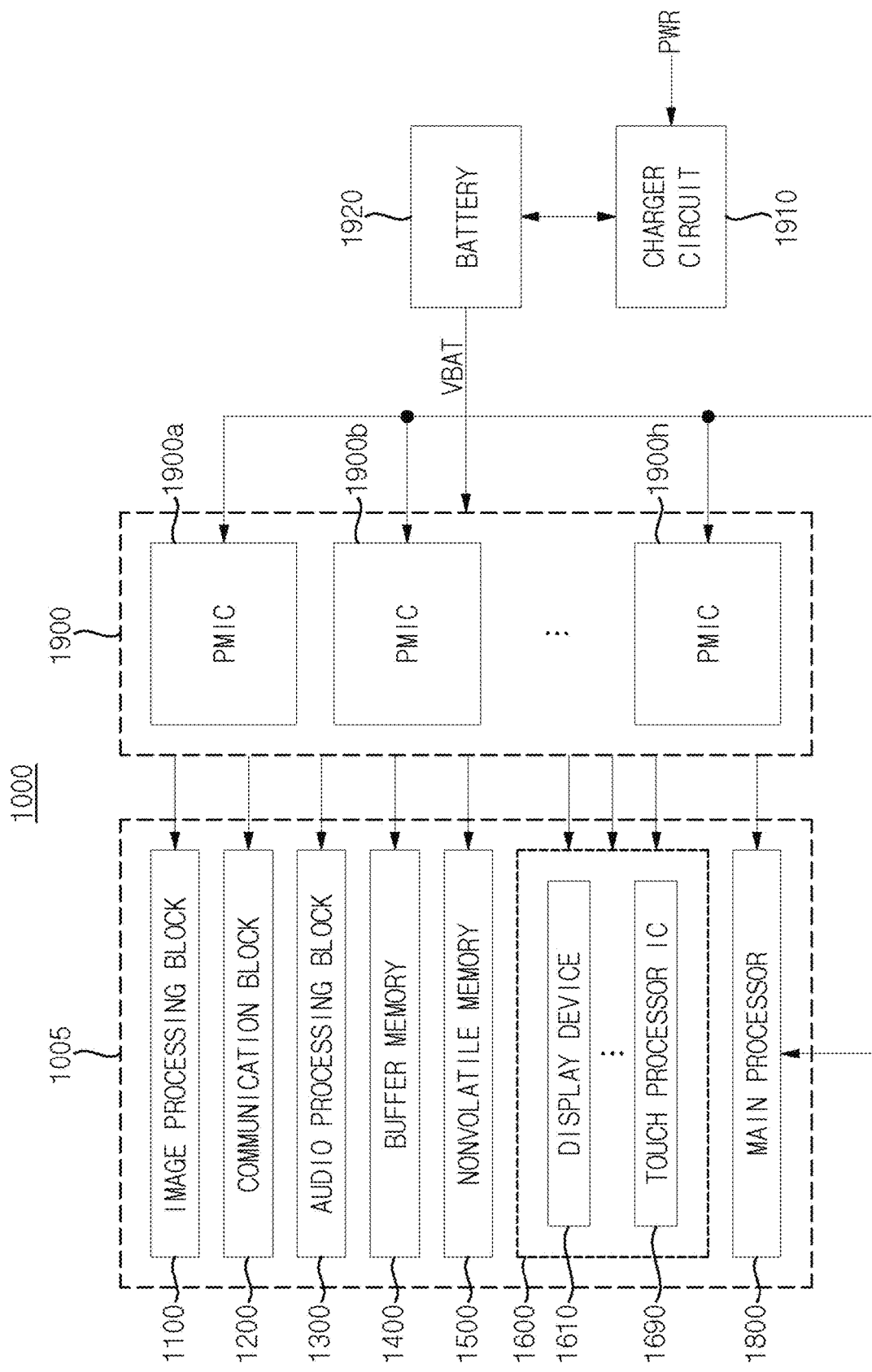
FIG. 20 is a schematic block diagram illustrating at least a portion of a circuit configuration that may be used for transmitting power to components in the electronic device of FIG. 19, according to example embodiments.

FIG. 20 illustrates a configuration associated with transmitting a power to components in the electronic device 1000 of FIG. 19, according to example embodiments.

The power management device 1900 may supply power to components 1100 to 1800 of the electronic device 1000 through corresponding voltage rails (i.e., power rails). For example, the charger circuit 1910 may charge the battery 1920 based on a power signal PWR received from outside the electronic device 1000 and the battery 1920 may provide the power management device 1900 with a battery voltage VBAT based on the charged voltage. The power management device 1900 may output a power to be supplied to the components 1100 to 1600 and 1800 of the electronic device 1000, based on the battery voltage VBAT. The power management device 1900 may supply power, which is obtained by appropriately converting the battery voltage VBAT, to the components 1100 to 1600 and 1800 of the electronic device 1000. The components 1100 to 1600 except the main processor 1800 may be referred to a load system 1005.

In an example embodiment, the power management device 1900 may include a plurality of PMICs 1900a, 1900b, ..., 1900h, each of which may supply power to at least one component of the electronic device 1000. For example, the voltage output from each PMIC may be transmitted to at least one of the image processing block 1100, the communication block 1200, the audio processing block 1300, the buffer memory 1400, the nonvolatile memory 1500, the user interface 1600 (e.g., input/output interfaces such as a display device 1610 and a touch processing integrated circuit (IC) 1690), and the main processor 1800. Each component of the electronic device 1000 may operate based on the transmitted voltage.

Voltages generated from the plurality of PMICs 1900a, 1900b, ..., 1900h may be transmitted to the components 1100 to 1800 of the electronic device 1000 in a predetermined order or may be blocked in a predetermined order. To this end, the plurality of PMICs 1900a, 1900b, ..., 1900h may be mutually synchronized during a power on sequence and a power off sequence.

Before performing the power on sequence, a main PMIC, one of the PMICs 1900a, 1900b, ..., 1900h, may enable first functions associated with a first initial operation based on the battery voltage VBAT during a stand-by period before generating first output voltages based on the battery voltage VBAT, and may apply a sub-enable signal to the at least one sub-PMIC (the at least one sub-PMIC may correspond to PMICs 1900a, 1900b, ..., 1900h except the main PMIC) through a first pin based on a power-on signal received from outside the electronic device 1000 after completing the first initial operation. Each of the sub-PMICs may receive the first sub-enable signal through a second pin and may enable second functions associated with a second initial operation based on the battery voltage, in response to an activation of the sub-enable signal. Therefore, the power management device 1900 may reduce stand-by current consumed during the stand-by period.

Before performing the power-on sequence, the main PMIC deactivates the sub enable signal in response to a deactivation of the power-on signal and applies the deactivated sub enable signal to the sub PMICs through a first pin. Each of the sub PMICs receives the deactivated sub enable signal through a second pin and disables the second functions. The main PMIC applies an activated sub enable signal to the sub PMICs, deactivates the first function after a predetermined time elapses from applying the activated sub enable signal to the sub PMICs and enters into an off state.

Each of the plurality of PMICs 1900a, 1900b, ..., 1900h may include an input buffer circuit according to example embodiments. The input buffer circuit may receive an inverted reset signal and an enable signal from an external host and may provide a second inverted reset signal and a second enable signal to a control logic therein by buffering the inverted reset signal and the enable signal. The input buffer circuit may generate the second inverted reset signal and the second enable signal by Schmitt-triggering the inverted reset signal and the enable signal based on a second power supply voltage that is being independent from a variation of the battery voltage VBAT.

The present disclosure may be applied to a PMIC, an SoC, and various devices and systems including the PMIC and the SoC, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, a wearable device, an IoT device, an IoE device, an e-book, a VR device, an AR device, a robotic device, etc.

While the present disclosure has been particularly shown and described with reference to the example embodiments thereof, it will be understood by those of ordinary skill in the art that various changes in form and detail may be made therein without departing from the spirit and scope of the present disclosure as defined by the following claims.

What is claimed is:

1. An input buffer circuit, comprising:
   a low voltage generator connected to a first power supply voltage having a first voltage level, the low voltage generator configured to generate a mirrored current based on the first power supply voltage and configured to generate a second power supply voltage having a second voltage level less than the first voltage level, the second power supply voltage being independent of a variation of the first power supply voltage;
   a first hysteresis buffer configured to operate based on the second power supply voltage and configured to generate a first inverted reset signal having hysteresis based on an inverted reset signal; and
   a first dual-supply level shifter configured to operate based on the first power supply voltage and the second power supply voltage and configured to generate a second inverted reset signal by shifting a logic high level of the first inverted reset signal from the second voltage level to the first voltage level.

2. The input buffer circuit of claim 1, wherein the low voltage generator comprises:
   a current source configured to generate a first current;
   a current mirror circuit, connected to the first power supply voltage and the current source, configured to generate a mirrored current by replicating the first current and configured to provide the mirrored current to a first node;
   a plurality of n-channel metal oxide semiconductor (NMOS) transistors coupled in series between the first node and a ground voltage, each of the plurality of NMOS transistors being diode-connected; and
   a power transistor that has a drain coupled to the first power supply voltage, a gate coupled to the first node and a source providing the second power supply voltage.

3. The input buffer circuit of claim 2, wherein the plurality of NMOS transistors provide the gate of the power transistor with a target voltage at the first node, the target voltage corresponding to a sum of threshold voltages of each of the plurality of NMOS transistors, and
   wherein the power transistor is configured to adjust a level of the second power supply voltage based on the target voltage.

4. The input buffer circuit of claim 3, wherein the power transistor corresponds to a native NMOS transistor having zero threshold voltage, and wherein the level of the second power supply voltage is about equal to a level of the target voltage.

5. The input buffer circuit of claim 3, wherein the power transistor corresponds to an NMOS transistor having a non-zero threshold voltage, and wherein the level of the second power supply voltage corresponds to a value obtained by subtracting a threshold voltage of the power transistor from the level of the target voltage.

6. The input buffer circuit of claim 3, wherein the level of the target voltage is determined based on a number of the plurality of NMOS transistors in the low voltage generator.

7. The input buffer circuit of claim 3, wherein the level of the target voltage is determined based on a size of each of the plurality of NMOS transistors in the low voltage generator.

8. The input buffer circuit of claim 2, wherein the current mirror circuit comprises:

a first p-channel metal-oxide semiconductor (PMOS) transistor that has a source coupled to the first power supply voltage, a gate coupled to the current source at a second node, and a drain coupled to the current source at the second node; and a second PMOS transistor that has a source coupled to the first power supply voltage, a drain coupled to the first node and a gate coupled to the second node, wherein the second PMOS transistor is configured to provide the mirrored current to the first node.

9. The input buffer circuit of claim 1, wherein the low voltage generator comprises:

a current source configured to generate a first current;

a current mirror circuit, connected to the first power supply voltage and the current source, configured to generate the mirrored current by replicating the first current and configured to provide the mirrored current to a first node;

a plurality of diodes coupled in a forward-biased direction between the first node and a ground voltage; and a power transistor that has a drain coupled to the first power supply voltage, a gate coupled to the first node, and a source providing the second power supply voltage.

10. The input buffer circuit of claim 1, wherein a level of a logic high voltage of the first hysteresis buffer and a level of a logic low voltage of the first hysteresis buffer are independent of the first power supply voltage.

11. The input buffer circuit of claim 1, wherein the first dual-supply level shifter comprises:

an inverter coupled between the second power supply voltage and a ground voltage, the inverter configured to output a first reset signal that is an inversion of the first inverted reset signal; and a shifting circuit coupled between the first power supply voltage and the ground voltage, the shifting circuit configured to receive the first inverted reset signal and the first reset signal and configured to output the second inverted reset signal by shifting a logic high level of the first inverted reset signal from the second voltage level to the first voltage level.

12. The input buffer circuit of claim 11, wherein the shifting circuit includes:

a first p-channel metal-oxide semiconductor (PMOS) transistor that is coupled between the first power supply voltage and a first node and has a gate coupled to a second node;

a second PMOS transistor that is coupled between the first power supply voltage and the second node and has a gate coupled to the first node;

a first n-channel metal-oxide semiconductor (NMOS) transistor that is coupled between the first node and the ground voltage and has a gate receiving the first inverted reset signal; and a second NMOS transistor that is coupled between the second node and the ground voltage and has a gate receiving the first reset signal, and wherein the shifting circuit is configured to output the second inverted reset signal at the second node.

13. The input buffer circuit of claim 1, further comprising:

a second hysteresis buffer configured to operate based on the second power supply voltage and configured to generate a first enable signal having hysteresis based on an enable signal; and a second dual-supply level shifter configured to operate based on the first power supply voltage and the second power supply voltage and configured to generate a second enable signal by shifting a logic high level of the first enable signal from the second voltage level to the first voltage level.

14. The input buffer circuit of claim 13, wherein a level of a logic high voltage of the second hysteresis buffer and a level of a logic low voltage of the second hysteresis buffer are independent of the first power supply voltage.

15. The input buffer circuit of claim 1, wherein the first power supply voltage corresponds to a battery voltage.

16. A power management integrated circuit (PMIC), comprising:

an input buffer circuit configured to generate a second inverted reset signal and a second enable signal by buffering an inverted reset signal and an enable signal provided from an external host, the inverted reset signal and the enable signal corresponding to general purpose input/output (GPIO) signals;

a voltage generator configured to be activated in response to a first internal enable signal and configured to generate a high power supply voltage to be provided to a display panel including a plurality of pixels, based on a first power supply voltage corresponding to a battery voltage;

a negative voltage generator configured to be activated in response to a second internal enable signal and configured to generate a low power supply voltage to be provided to the display panel, based on the first power supply voltage; and control logic configured to generate the first internal enable signal and the second internal enable signal based on the second inverted reset signal and the second enable signal, respectively, wherein the input buffer circuit comprises:

a low voltage generator connected to the first power supply voltage having a first voltage level, the low voltage generator configured to generate a mirrored current based on the first power supply voltage and configured to generate a second power supply voltage having a second voltage level less than the first voltage level, the second power supply voltage being independent of a variation of the first power supply voltage;

a first hysteresis buffer configured to operate based on the second power supply voltage and configured to generate a first inverted reset signal having hysteresis based on the inverted reset signal; and a first dual-supply level shifter configured to operate based on the first power supply voltage and the second power supply voltage and configured to generate the second inverted reset signal by shifting a logic high level of the first inverted reset signal from the second voltage level to the first voltage level.

17. The PMIC of claim 16, wherein the low voltage generator comprises:

a current source configured to generate a first current;

a current mirror circuit, connected to the first power supply voltage and the current source, configured to generate the mirrored current by replicating the first current and configured to provide the mirrored current to a first node;

a plurality of n-channel metal oxide semiconductor (NMOS) transistors coupled in series between the first node and a ground voltage, each of the plurality of NMOS transistors being diode-connected; and a power transistor that has a drain coupled to the first power supply voltage, a gate coupled to the first node, and a source providing the second power supply voltage, wherein a level of a logic high voltage of the first hysteresis buffer and a level of a logic low voltage of the first hysteresis buffer are independent of the first power supply voltage.

18. The PMIC of claim 17, wherein the low voltage generator is configured to provide the gate of the power transistor with a target voltage at the first node, the target voltage corresponding to a sum of threshold voltages of the plurality of NMOS transistors, and wherein the power transistor is configured to adjust a level of the second power supply voltage based on the target voltage.

19. The PMIC of claim 16, wherein the input buffer circuit further comprises:

a second hysteresis buffer configured to operate based on the second power supply voltage and configured to generate a first enable signal having hysteresis based on an enable signal corresponding to one of the GPIO signals; and a second dual-supply level shifter configured to operate based on the first power supply voltage and the second power supply voltage and configured to generate a second enable signal by shifting a logic high level of the first enable signal from the second voltage level to the first voltage level, wherein a level of a logic high voltage of the second hysteresis buffer and a level of a logic low voltage of the second hysteresis buffer are independent of the first power supply voltage.

20. An input buffer circuit, comprising:

a low voltage generator connected to a first power supply voltage having a first voltage level, the low voltage generator configured to generate a mirrored current based on the first power supply voltage and configured to generate a second power supply voltage having a second voltage level smaller than the first voltage level, the second power supply voltage being independent of a variation of the first power supply voltage;

a hysteresis buffer configured to operate based on the second power supply voltage and configured to generate a first inverted reset signal having hysteresis based on an inverted reset signal supplied to the hysteresis buffer; and a dual-supply level shifter configured to operate based on the first power supply voltage and the second power supply voltage and configured to generate a second inverted reset signal by shifting a logic high level of the first inverted reset signal from the second voltage level to the first voltage level, wherein the low voltage generator includes a plurality of n-channel metal oxide semiconductor (NMOS) transistors and a power transistor, the plurality of NMOS transistors being coupled in series between a first node and a ground voltage, each of the plurality of NMOS transistors being diode-connected, the power transistor being coupled between the first power supply voltage and the first node, wherein the low voltage generator is configured to:
  generate the mirrored current by replicating a first current and providing the mirrored current to a first node; and
  generate the second power supply voltage by providing a gate of the power transistor with a target voltage at the first node, the target voltage corresponding to a sum of threshold voltages of the plurality of NMOS transistors.

* * * * *